United States Patent
Klee et al.

(10) Patent No.: US 8,193,685 B2
(45) Date of Patent: Jun. 5, 2012

(54) THIN FILM DETECTOR FOR PRESENCE DETECTION

(75) Inventors: Mareike Klee, Straelen (DE); Ronald Dekker, Valkenswaard (NL); Harry Van Esch, Budel-dorplein (NL); Marco De Wild, Eindhoven (NL); Ruediger Mauczok, Erkelenz (DE); Chris Van Heesch, Eindhoven (NL); Willem Franke Pasveer, Dordrecht (NL); Engel Johannes Knibbe, Heeze (NL); Remco Alphonsus Hendrikus Breen, Etten-leur (NL); Klaus Reimann, Eindhoven (NL); Biju Kumar Sreedharan Nair, Delft (NL); Roger Peter Anna Delnoij, Lommel (BE); Henri Marie Joseph Boots, Best (NL); Christina Adriana Renders, Riethoven (NL); Olaf Wunnicke, Eindhoven (NL); Derk Reefman, Best (NL); Peter Dirksen, Valkenswaard (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/666,831

(22) PCT Filed: Jun. 30, 2008

(86) PCT No.: PCT/IB2008/052610
§ 371 (c)(1),
(2), (4) Date: Jun. 14, 2010

(87) PCT Pub. No.: WO2009/004558
PCT Pub. Date: Jan. 8, 2009

(65) Prior Publication Data
US 2010/0277040 A1 Nov. 4, 2010

(30) Foreign Application Priority Data

Jul. 3, 2007 (EP) .................................... 07111625

(51) Int. Cl.
*H01L 41/08* (2006.01)
(52) U.S. Cl. ...................... 310/344; 310/313 R; 310/324
(58) Field of Classification Search .................. 310/324, 310/330–332
See application file for complete search history.

(56) References Cited

U.S. PATENT DOCUMENTS 3,509,387 A * 4/1970 Thorn et al. .................. 310/324
(Continued)

FOREIGN PATENT DOCUMENTS

DE 4218789 A1 6/1992
(Continued)

OTHER PUBLICATIONS

Yamashita et al., "Sensitivity improvement of diaphragm type ultrasonic sensors by complementary piezoelectric polarization", Science Direct, 2005, pp. 119-122, Japan.
(Continued)

*Primary Examiner* — Mark Budd
(74) *Attorney, Agent, or Firm* — Mark L. Beloborodov

(57) ABSTRACT

A transducer (800) is provided where a membrane (830) is formed over a front substrate (615); and a piezoelectric layer (820) is formed over the membrane (830) at an active portion (821) and peripheral portions located adjacent the active portion (821). A patterned conductive layer including first and second electrodes (840, 845) is formed over the piezoelectric layer (820). Further, a back substrate structure is provided having supports (822, 824) located at the peripheral portions adjacent the active portion (821). The height (826) of the supports (822, 824) is greater than a combined height (828) of the patterned piezoelectric layer and the patterned conductive layer. Many transducers may be connected to form an array, where a controller may be provided for controlling the array, such as steering a beam of the array, and processing signals received by the array, for presence or motion detection and/or imaging, for example.

8 Claims, 27 Drawing Sheets

U.S. PATENT DOCUMENTS

| | | | |
|---|---|---|---|
| 4,751,419 A * | 6/1988 | Takahata | 310/324 |
| 5,406,163 A * | 4/1995 | Carson et al. | 310/334 |
| 6,323,580 B1 | 11/2001 | Bernstein | |
| 6,329,739 B1 | 12/2001 | Sawano | |
| 6,472,798 B2 * | 10/2002 | Kishimoto | 310/344 |
| 6,515,402 B2 | 2/2003 | Klee et al. | |
| 6,548,937 B1 | 4/2003 | Klee et al. | |
| 6,549,487 B2 | 4/2003 | Gualtieri | |
| 6,671,230 B1 | 12/2003 | Benjamin | |
| 2003/0141783 A1 * | 7/2003 | Klee et al. | 310/324 |
| 2006/0100522 A1 | 5/2006 | Yuan et al. | |
| 2006/0292729 A1 | 12/2006 | Ohguro | |
| 2007/0013264 A1 * | 1/2007 | Wilser et al. | 310/311 |
| 2007/0013268 A1 * | 1/2007 | Kubo et al. | 310/324 |
| 2007/0057599 A1 * | 3/2007 | Motai et al. | 310/324 |

FOREIGN PATENT DOCUMENTS

| | | |
|---|---|---|
| EP | 0145429 A2 | 3/1984 |
| EP | 0294826 A1 | 12/1988 |
| EP | 1489740 A2 | 12/2004 |
| EP | 1707367 A2 | 10/2006 |
| EP | 1708290 A2 | 10/2006 |
| WO | 03092915 A2 | 11/2003 |

OTHER PUBLICATIONS

Magori, "Ultrasonic sensors in air", Ultrasonics Symposium, Corporate Research and Development, 1994, pp. 471-481, Germany.

Wang et al., "Ultrasound radiating performances of piezoelectric micromachined ultrasonic transmitter", Applied Physics Letter, 2005, pp. 1-3, Singapore.

* cited by examiner

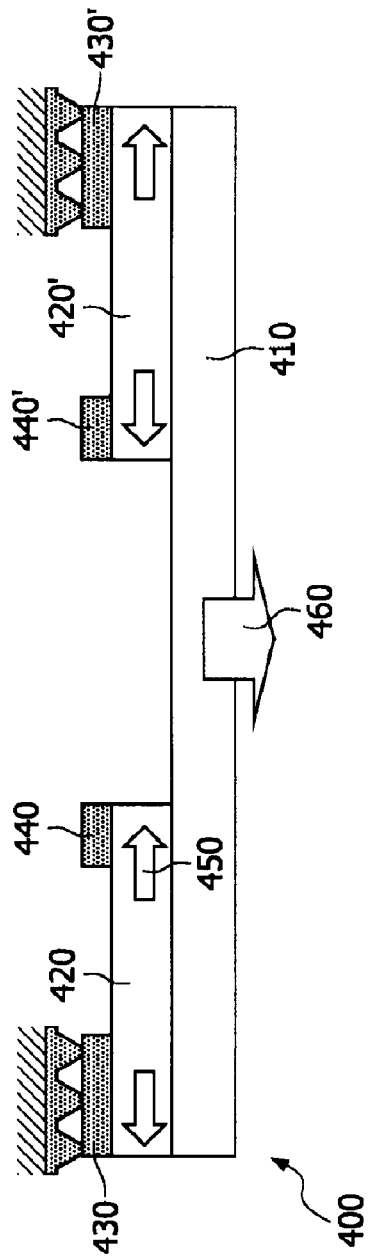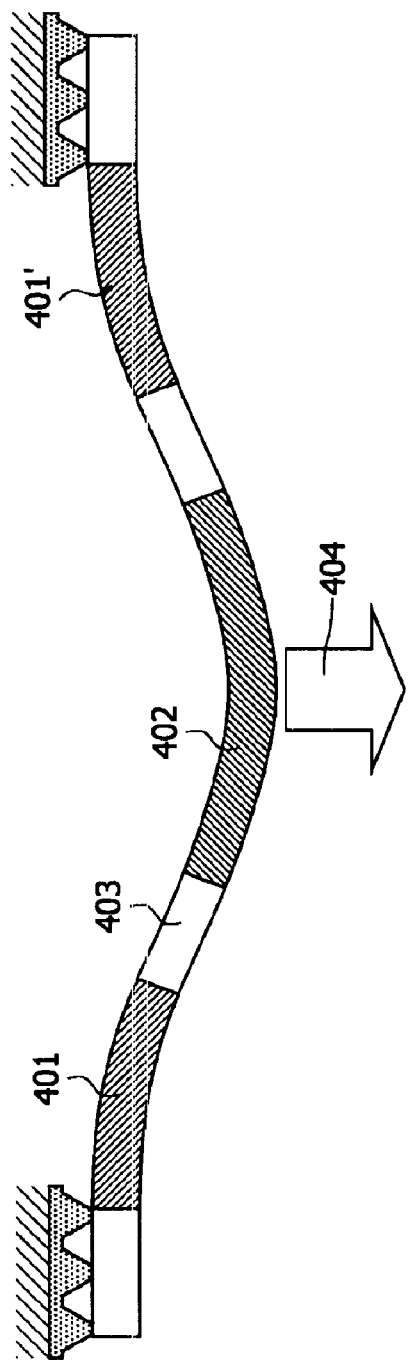
FIG. 4A
FIG. 4B

THIN FILM DETECTOR FOR PRESENCE DETECTION

The present system relates to transducers such as for presence detection, motion detection and real time imaging using ultrasound transducers including thin film ultrasound transducers and arrays for presence and/or motion detection of object(s) and real-time imaging, including inanimate and animate object(s), and determination of various parameters such as speed, location, and/or the number of the object(s).

Transducers are finding wide applications such as sensors for motion and presence detection. Major driving factors are saving energy in office buildings and homes to turn lights on/off as needed, as well as to increase lamp life. The motion/presence detection sensor market is estimated to grow rapidly. With this growing area, compact, low cost and low profile (nearly invisible) sensors are desired with minimum false detections or triggers. It is further desirable for such sensors to be more intelligent, to enable detection of number of people and location of people in a room, we well as detection of motion and direction of motion of the people in the room, for example. Furthermore, transducers are of relevance which operate at low power, to enable wireless operation.

Ultrasound transducers are also attractive as sensors for other applications such as outdoor controls, for example, to switch on/off lights or to dime lights locally e.g., in cities, building, streets, etc. They can also be applied for intruder detection, which automatically switch on surveillance devices.

Current motion sensors include ceramic ultrasound motion detectors and passive infrared (IR) detectors, based on pyroelectric ceramic devices. Such conventional IR devices are very bulky, and are typically mounted on the ceiling of a room. Patent Document DE4218789 by Klee et al. describes a micro-machined pyroelectric detector and is incorporated herein by reference in its entirety. The IR sensors detect moving persons or the motion of humans from changes in received infrared energy. Disadvantages of these pyroelectric IR detectors include the need for line of sight for proper detection that should be clear and unobstructed. Further, IR detectors are easily disturbed by direct sun-light and a change in ambient light and are sensitive to smoke and heat, thus providing false alarms.

To minimize false alarms or triggers, combinations of pyroelectric passive detectors and ultrasound detectors are used, where ultrasound transducers are mounted next to a passive infrared detector. Such combined devices are even larger than the typical IR detector, having a typical size of 11 cm in diameter and 3.5 cm height. FIG. 1 shows the radiation pattern 100 of a typical transducer. As shown in FIG. 1, typically a transducer transmits a fairly narrow beam 110 and thus has large blind areas 120, 130.

To reduce or eliminate blind areas, an array of transducers is provided where signals from each element or transducer of the array are individually controlled to shape and steer the ultrasonic beam transmitted from the array. This enables, e.g., scanning through a room or area to detect the location of people. Using a transducer array, it is also possible to focus the beam, which improves resolution and signal to noise. The ultrasound arrays also enable, using associated electronic circuitry, to detect and form ultrasound images.

Such ultrasound sensors are also envisaged for air bag control in vehicles to turn on/off passenger airbags depending on detection of the presence or absence of a passenger. Other applications for transducers include measuring distance. In addition, such transducers can also be of interest for automotive purposes such as passenger occupancy sensors to turn on/off airbags. Further, ultrasound transducers are also used in crash prevention or protection systems, as described in U.S. Pat. No. 6,549,487 to Gualtieri, which is incorporated herein by reference in its entirety, where an electronically steered ultrasonic beam is used to measure range, angular extent and angular direction of an object. Ultrasonic receivers receive acoustic waves reflected from objects for processing to determine information such as range, extent, size and direction of such objects. These systems are typically built from discrete single transducers.

Piezoelectric ultrasonic sensors on silicon diaphragms are known, such as described in an article by Kaoru Yamashita et al. entitled "Sensitivity Improvement of Diaphragm Type Ultrasonic Sensors by Complementary Piezoelectric Polarization" (Yamashita), which is incorporated herein by reference in its entirety. Further, an article by Valentin Magori entitled "Ultrasonic Sensors in Air," which is also incorporated herein by reference in its entirety, describes intelligent ultrasonic sensors including piezoelectric ultrasonic transducers operated as phased arrays, with electronic steering of the radiated beam, for object recognition and detection of distances based on echoes reflected from the object.

As noted in Yamashita, three-dimensional imaging devices using airborne ultrasound may be used for vehicle control, object detection for autonomous robots, and activity support for visually handicapped people and inspection robots. As noted, ultrasonic measurement in air has an advantage against electromagnetic wave, including light and milli-meter wave in precise distance measurement, in the range of less than a few meters because of the adequately low propagation speed of ultrasonic waves.

U.S. Pat. Nos. 6,515,402, and 6,548,937, both to Klee at al, assigned to the assignee hereof, the content of each of which is incorporated herein by reference in its entirety, describe an array of ultrasound transducers where electrodes may be on one side of a piezoelectric layer, or on both sides as also described in Yamashita. Such transducers have a substrate which is micro-machined to form an opening.

FIG. 2A shows an ultrasound transducer 200 as described in U.S. Pat. No. 6,548,937 having a silicon substrate 210 over which a membrane 220 is formed. A barrier structure 230, such as a TiO$_2$ layer, is formed over the membrane 220. A piezoelectric layer 240 is formed over the barrier layer 230. First and second electrodes 250, 255 are disposed at laterally opposite ends of the piezoelectric layer 240, for laterally poled operation of the piezoelectric layer 240. Further, a portion of the substrate 210 is removed to create an opening 260 to expose the membrane 220 at the proper location in relation to the piezoelectric layer 240 and electrodes 250, 255. To manufacture an array of such ultrasound transducers, several openings are generated for the creation of several membranes on one silicon substrate. The membrane 220 exposed by the opening 260 is capable of oscillating (e.g., upon application of an AC voltage) thanks to this opening 260.

In particular, application of an AC voltage to the electrodes 250, 255 through the first and second current supply contacts 270, 275 causes the piezoelectric layer 240 to be excited into a longitudinal oscillation in the plane of the layer 240. The change in length of the piezoelectric element excites the membrane 220 into oscillation. The electrodes 250, 255 may be inter-digital electrodes 250, 255 as shown in FIG. 2B.

FIG. 2C shows an ultrasound transducer 200' as described in U.S. Pat. No. 6,515,402 and Yamashita, where the electrodes 250', 255' are formed on both sides of the piezoelectric layer 240. Both transducer 200, 200' shown in FIGS. 2A, 2C, require creating the opening 260 at the proper location by removing portion of the substrate 210 such as by bulk micromachining techniques, or pattern lithography which is time consuming and increases the cost of manufacturing such transducer arrays. Further, the substrate must be aligned to create the opening at the proper location which further increases manufacturing time and cost, as well as introduces errors thus reducing yield. In addition, SOI (Silicon on Insulator) wafers are typically used, as described in Yamashita, which are relatively expensive, where the membrane is formed from silicon (2 µm) and silicon oxide (0.4 µm).

It should be noted that the electric field is between the two opposing electrodes 250', 255' in FIG. 2C. This electric field is perpendicular to the piezoelectric layer. By contrast, the electric field between the two adjacent electrodes 250, 575 in FIG. 2A is parallel to or in the plane of the piezoelectric layer 240. By providing closely spaced electrodes, which are typically inter-digital as shown in FIG. 2B, less voltage is required to produce a desired electric field than with just two electrodes for each membrane.

Of course, in addition to using airborne ultrasound for imaging, ultrasound is also applied in fluids and solids and used for imaging, such as medical sonography and underwater imaging, where thin ferroic films may be used as describe in U.S. Pat. No. 6,323,580 to Bernstein (hereinafter referred to as Bernstein), which is incorporated herein by reference in its entirety. In Bernstein, inter-digital electrodes are formed on only one side of a ferroic diaphragm formed over an insulator layer of $Al_2O_3$ which, in turn, rests on a structural layer of silicon membrane. The silicon membrane rests on an etch stop layer of $SiO_2$ or $Si_3N_4$ formed over a silicon substrate. The silicon substrate is selectively etched (up to the $SiO_2$ or $Si_3N_4$ etch stop layer) to form an opening below the silicon membrane. It should be noted that an expensive SOI wafer technology is used, as well an additional $Al_2O_3$ layer is applied which further increases processing time and cost. Cost is further increased since, similar to the opening 260 described in connection with FIGS. 2A-2B, the Bernstein opening is also formed from selective substrate removal, such as by etching and micro-machining, where 2-side lithography and alignment are needed to properly provide the opening at the desired location below the electrodes, for example.

Another micro-machined transducer is described in an article by Zhihong Wang et al., entitled "Ultrasound Radiating Performances of Piezoelectric Micromachined Ultrasonic Transmitter," (Wang) which is incorporated herein by reference in its entirety. This transducer also requires substrate alignment and micro-machining to form an aligned opening in the substrate. In Wang, the membrane is formed of $Si_3N_4$ with a $SiO_2$ etch-stop layer formed between the $Si_3N_4$ membrane and the Si substrate.

Accordingly, there is need for improved miniature sensors that are thinner, less bulky, and flexible, and are less expensive and simpler to manufacture, with reduced steps and/or reduced alignment requirements, and yet have a high electroacoustic performance. The integration of other functionality, such as infrared detection, would enable even further miniaturization.

One objective of the here presented systems and methods is to overcome the disadvantages of conventional sensors, including providing sensors with combined ultrasound and pyroelectric detectors for detecting ultrasound and/or infrared signals.

According to illustrative embodiments, a transducer and an array of transducers are provided which may be used, e.g., for real-time imaging in air, as well as fluid and solids, and for presence and/or motion detection of object(s) by using Doppler effects, for example, including inanimate and animate object(s), and determination of various parameters such as speed, direction of movement, location, and/or the number of the object(s). In one embodiment, the transducer comprises a membrane formed over a front substrate; a piezoelectric layer is formed over the membrane at an active portion and peripheral portions which are adjacent the active portion. If desired, the piezoelectric layer may be patterned. A patterned conductive layer including first and second electrodes is formed over the piezoelectric layer. Further, a back substrate structure is provided having supports located at the peripheral portions adjacent the active portion. The height of the supports is greater than a combined height of the patterned piezoelectric layer and the patterned conductive layer. Many transducers may be connected to form an array, where a controller may be provided for controlling the array, such as steering a beam of the array, and processing signals received by the array, for presence or motion detection and/or imaging, for example.

Various sensors may be provided on flexible foils to form flexible sensors which may be formed into any desired shape. Further, different type of sensors or detectors may be combined or integrated into a single multi-sensor, such as a multi-sensor including combined ultrasound and pyroelectric detectors for detecting ultrasound and/or infrared signals. The sensors may be used in various applications, such as imaging (ultrasound and/or IR imaging) as well as motion or presence detection, where the ultrasound sensor(s) does not require line of sight for operation, in contrast to the IR sensor(s) which does require line of sight for operation, including transmission and/or reception of ultrasound and/or IR signals.

Further areas of applicability of the present systems and methods will become apparent from the detailed description provided hereinafter. It should be understood that the detailed description and specific examples, while indicating exemplary embodiments of the systems and methods, are intended for purposes of illustration only and are not intended to limit the scope of the invention.

These and other features, aspects, and advantages of the apparatus, systems and methods of the present invention will become better understood from the following description, appended claims, and accompanying drawing where:

FIGS. 4A-4B shows a transducer having electrodes on one side according to one embodiment of the present system;

Figure 16A:
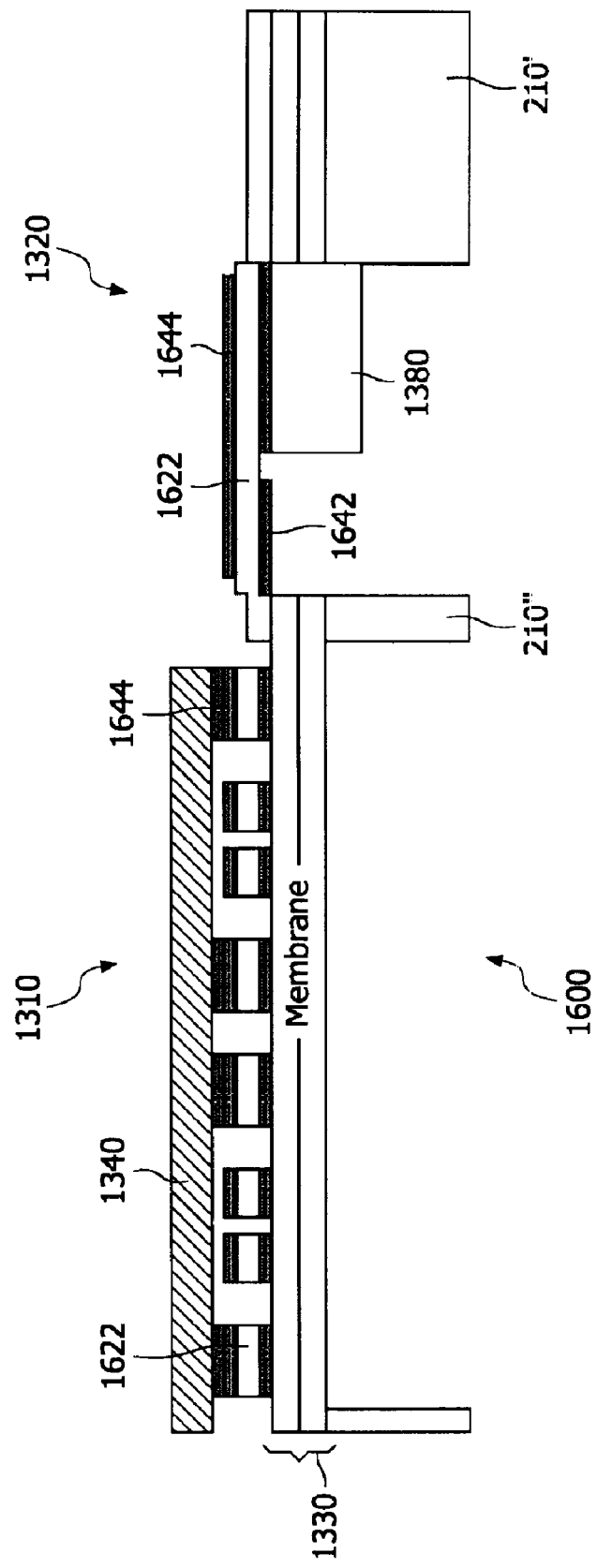
Figure 16B:
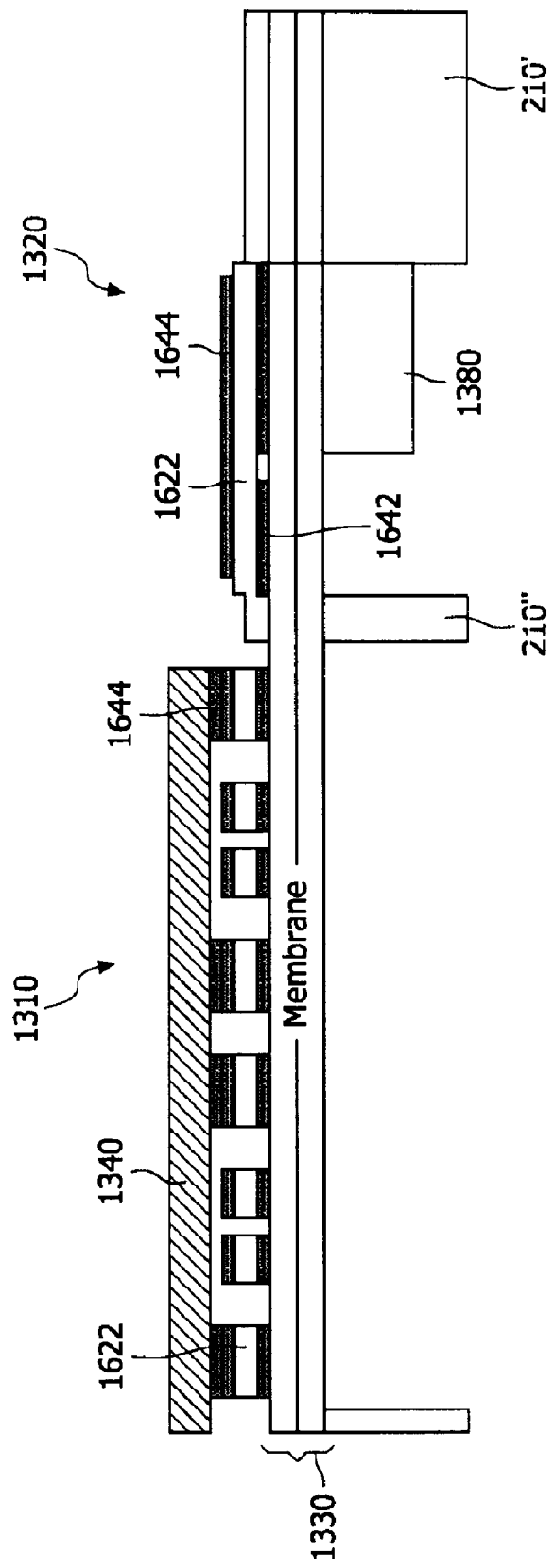
Figure 17A:
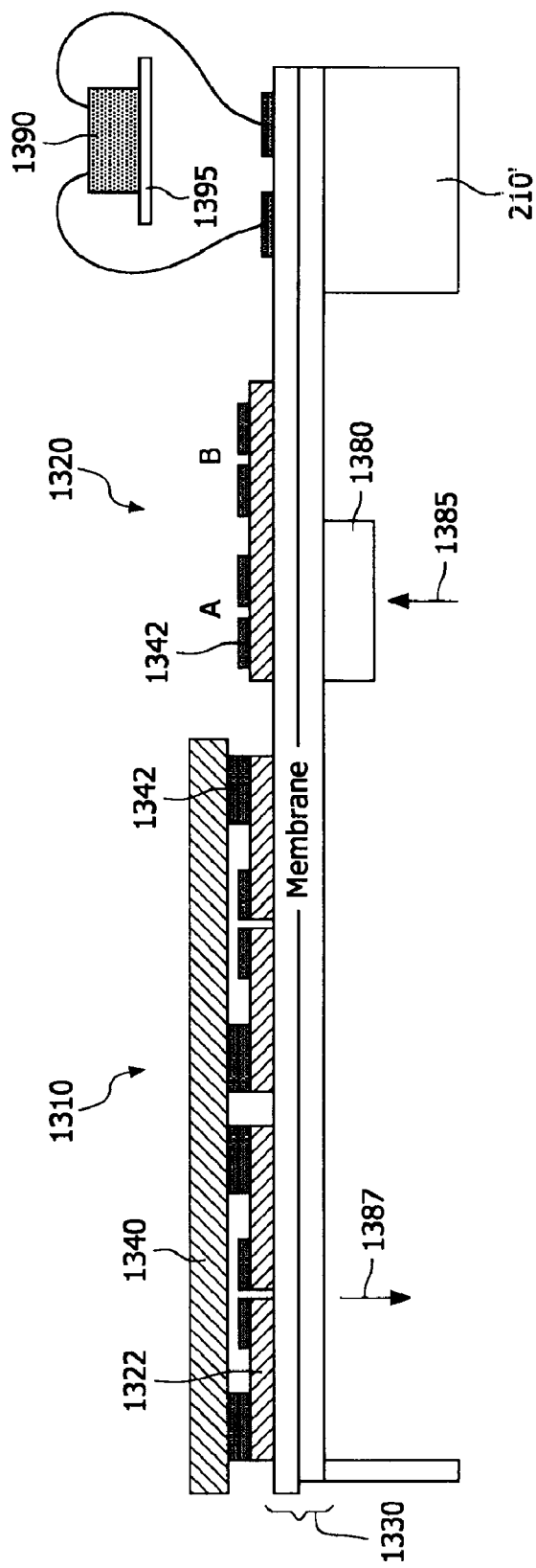
Figure 17B:
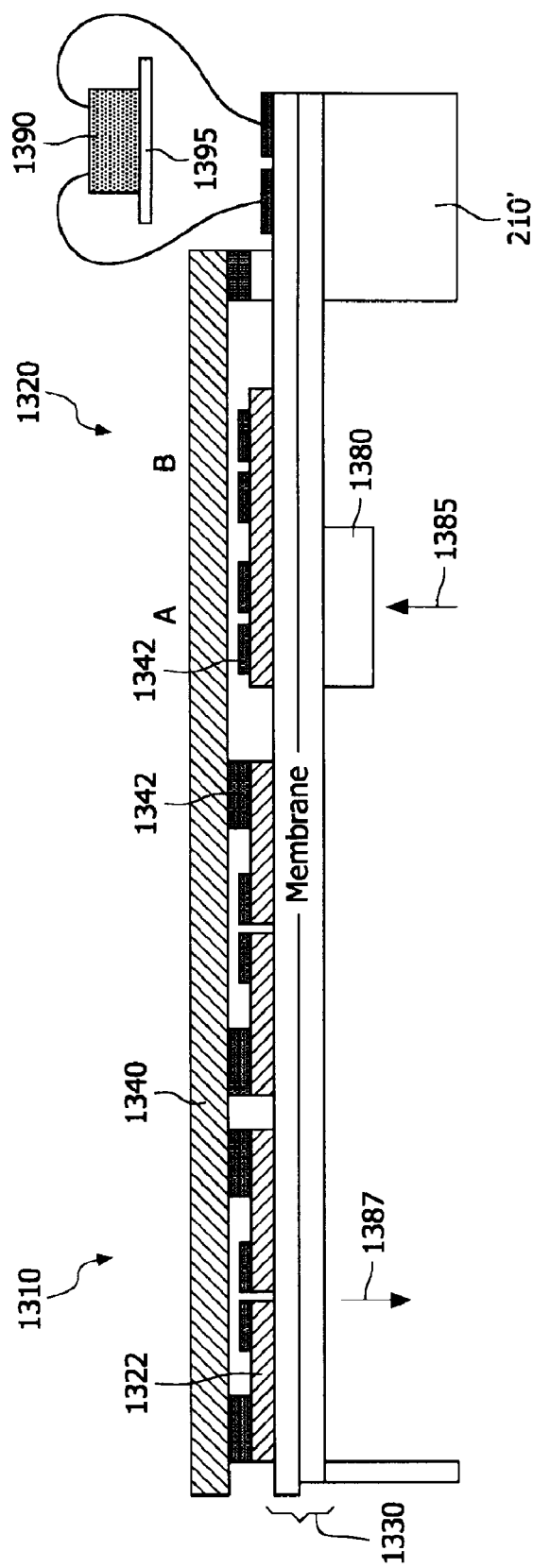
Figure 17C:
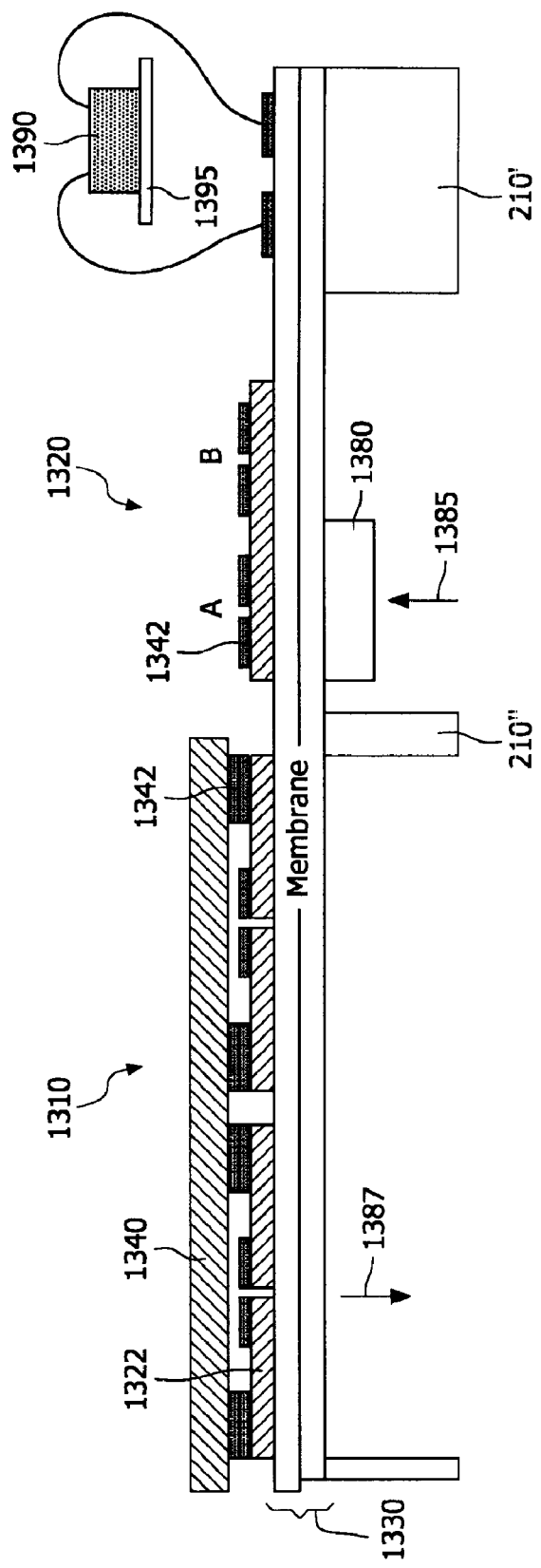

FIGS. 16A-16B show arrays including a combination of an ultrasound transducer and a pyroelectric transducer with electrodes on both sides of piezoelectric regions according to one embodiment of the present system; and FIGS. 17A-17C show arrays including a combination of an ultrasound transducer and a pyroelectric transducer having differently doped piezoelectric regions according to one embodiment of the present system.

The following are descriptions of illustrative embodiments that, when taken in conjunction with the drawings, will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims.

Thus, the following description of certain exemplary embodiments is merely exemplary in nature and is in no way intended to limit the invention, its applications, or uses. In the following detailed description of embodiments of the present systems and methods, reference is made to the accompanying drawings which form a part hereof, and in which are shown by way of illustration specific embodiments in which the described systems and methods may be practiced. These embodiments are described in sufficient detail to enable those skilled in the art to practice the presently disclosed systems and methods, and it is to be understood that other embodiments may be utilized and that structural and logical changes may be made without departing from the spirit and scope of the present system.

The following detailed description is therefore not to be taken in a limiting sense, and the scope of the present system is defined only by the appended claims. The leading digit(s) of the reference numbers in the figures herein typically correspond to the figure number, with the exception that identical components which appear in multiple figures are identified by the same reference numbers. Moreover, for the purpose of clarity, detailed descriptions of well-known devices, circuits, and methods are omitted so as not to obscure the description of the present system.

Various embodiments of the present sensor including piezoelectric thin film transducer(s) and transducer array(s) allow for cost effective, efficient and miniature ultrasound transducers/arrays. The ultrasound transducer according the various embodiments is a flat, low profile ultrasound transducer, which is less bulky than conventional ceramic ultrasound transducers used for occupancy and/or motion detection, for example. Another embodiments includes a flat, low profile thin film transducer array, which enables scanning and electronic steering of the ultrasound beam to detect various parameters such as presence, speed, direction of movement, location, motion and/or the number of live and inanimate objects, such as humans, animals, vehicles, etc. Such compact and low profile ultrasound transducers/arrays may find various application, particularly since they do not need line of sight and are insensitive to smoke and heat in contrast to infrared sensors.

Figure 3:
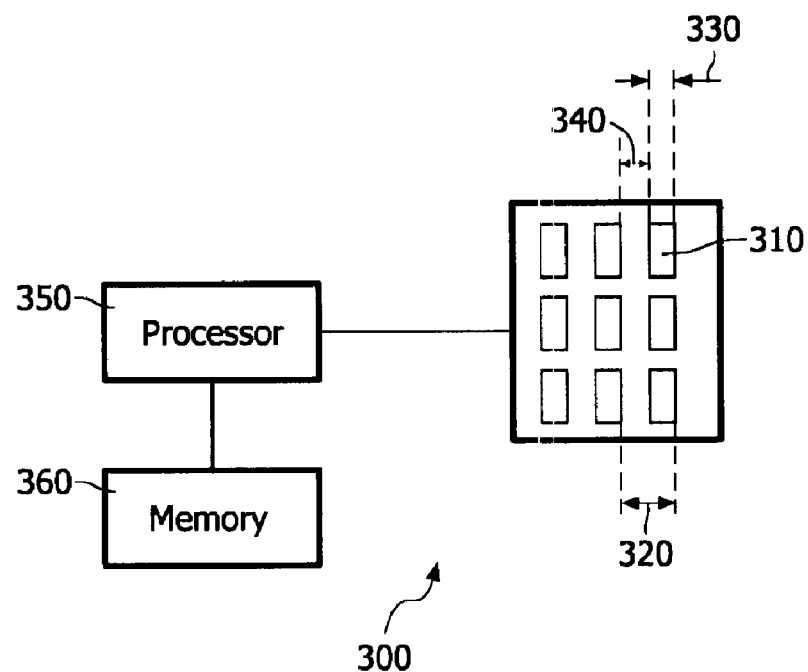
FIG. 3 shows an array of transducers according to one embodiment of the present system.

In an illustrative embodiment, thin film piezoelectric transducer arrays are used for presence and/or motion detection or the like, where FIG. 3 shows an array 300 of thin film piezoelectric transducer elements 310. The array 300 and/or each element 310 may have any size and shape. The pitch 320 of the elements 310 is selected based on application. For motion detectors, to achieve a low attenuation in air, the arrays are designed to operate at frequencies of 50-450 KHz. To operate at these low frequencies, the element pitches 320 are approximately a few hundred micrometers to several thousand micrometers. The pitch 320 is the width 330 of an element plus the gap 340 that separate one element from an adjacent element.

Figure 1:
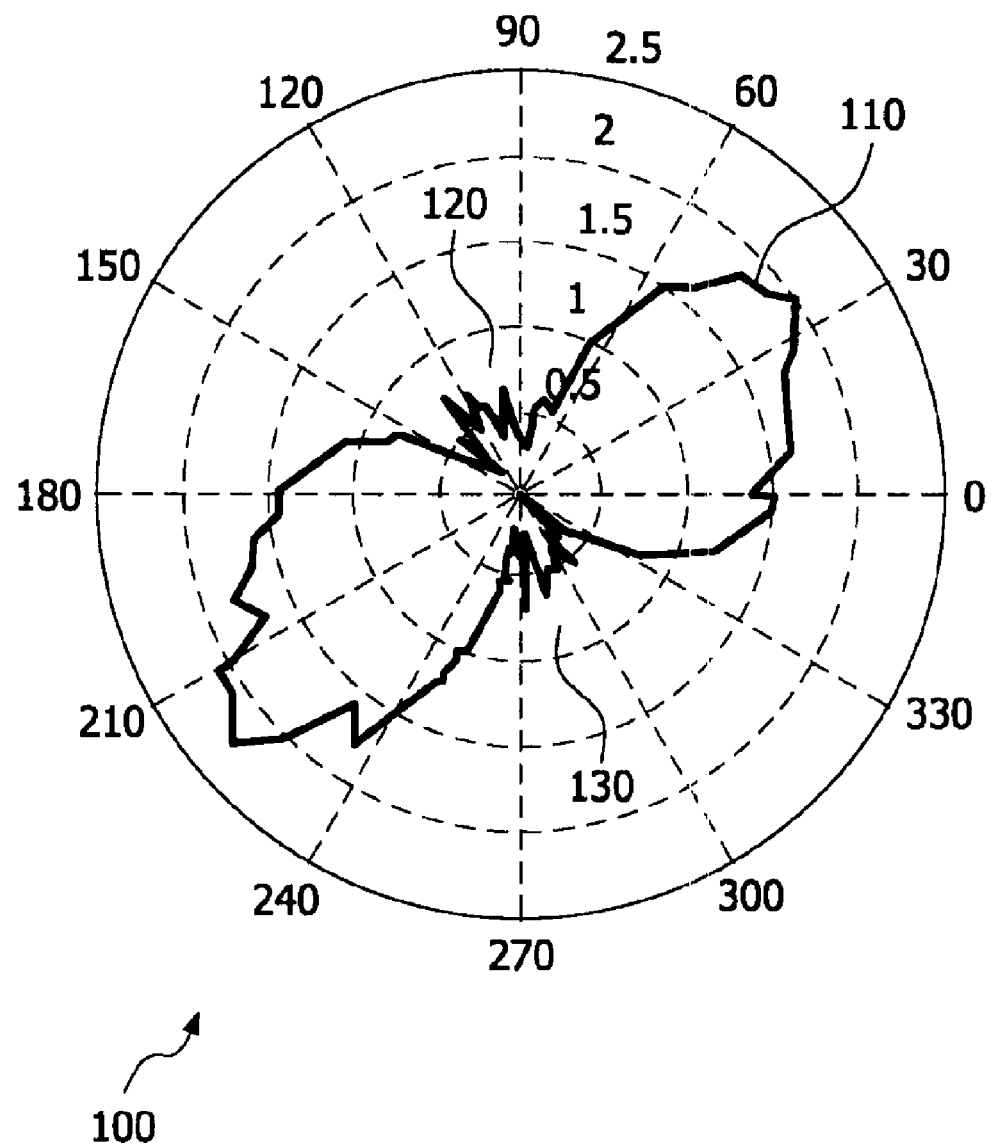
FIG. 1 shows measurements of the radiation pattern of a typical transducer.

As shown in FIG. 3, the array may be connected to a controller or processor 350 with associated electronics, such as phase shifters, delay taps, converters and the like, as described in U.S. Pat. No. 6,549,487 to Gualtieri, for control of the array and processing information received from the array 300, such as to enable electronic steering the ultrasonic beam for wider coverage and reduction or elimination of blind spot 120, 130 described in connection with FIG. 1. A memory 360 may also be operatively coupled to the processor 350 for storing various data and application programs and software instructions or codes for control and operation of the array system when executed by the processor 350.

In order to achieve a high coupling coefficient of the devices, which is the amount of electrical energy transferred into mechanical energy (i.e., the efficiency of the electromechanical conversion), a sensor 400 is provided, as shown in FIG. 4A where, instead of electrodes at opposite sides of the piezoelectric material, the electrodes are processed on the same side of the piezoelectric thin film, and the elements operate in a poling direction parallel to the plane of the transducer. In particular, the in-plane electric field between a pair of electrode 430, 440, and 430', 440', which may be interdigitated as shown in FIG. 2B, causes longitudinal stress oscillation in the plane of the piezoelectric thin film that in turn leads to a flexural oscillation of the membrane. A reduced spacing between the electrodes 430, 440 allows operation at lower voltages. In the following description, "positive" and "negative" voltages are used to indicate that the electric field in the piezoelectric material is parallel or anti-parallel to the poling direction, respectively.

The sensor 400, besides having higher coupling coefficients, also requires less processing steps since there is one less layer due to the lack of an electrode layer on one side of the piezoelectric thin film, which enables a cost effective production of such devices 400. The sensor 400 includes a membrane 410 formed on a substrate which is removed after formation of the sensor 400 to allow movement of the membrane 410. Piezoelectric material 420, 420' is formed on the membrane 410 which, for example, may be patterned if desired to increase performance. Further, a pair of electrodes 430, 440, 430', 440' is formed over respective piezoelectric regions 420, 420' of the patterned piezoelectric material.

As shown in FIG. 4A, when a positive voltage is applied to the inner edge electrode 440, 440', and a negative is applied to the outer edge electrode 430, 430', which may alternatively be grounded, elongation 450 of the piezoelectric layers results in a downward bending 460 of the membrane stack, as shown in FIG. 4B. Reversing the polarity of the voltages applied to the electrodes pairs 430, 440 and 430', 440', bends the membrane stack upward. Voltage pulses or any alternating current (AC) signal applied to the piezoelectric layers create ultrasonic waves that may be reflected from objects for detection thereof.

The operation principle of a membrane transducer is explained in FIG. 4B, where the fundamental bending mode is depicted. A displacement 404 of the membrane results in bending of the sections 401, 401' and 402. The sections 403 remain almost unstrained. Piezoelectric actuation is used to bend one or several curved sections 401, 401', or 402. A layered membrane is used at least in these strainable or movable parts 401, 401', 402 and will be exemplified in the following sections. The given implementations should impose no limitation on the freedom of choosing which section of the membrane is actuated. For example, the stack 440, 430, 420, 410 of FIG. 4A forms the actuation section 401 shown in FIG. 4B. Of course, a strainable or movable stack may also be placed at section 402.

Figure 5:
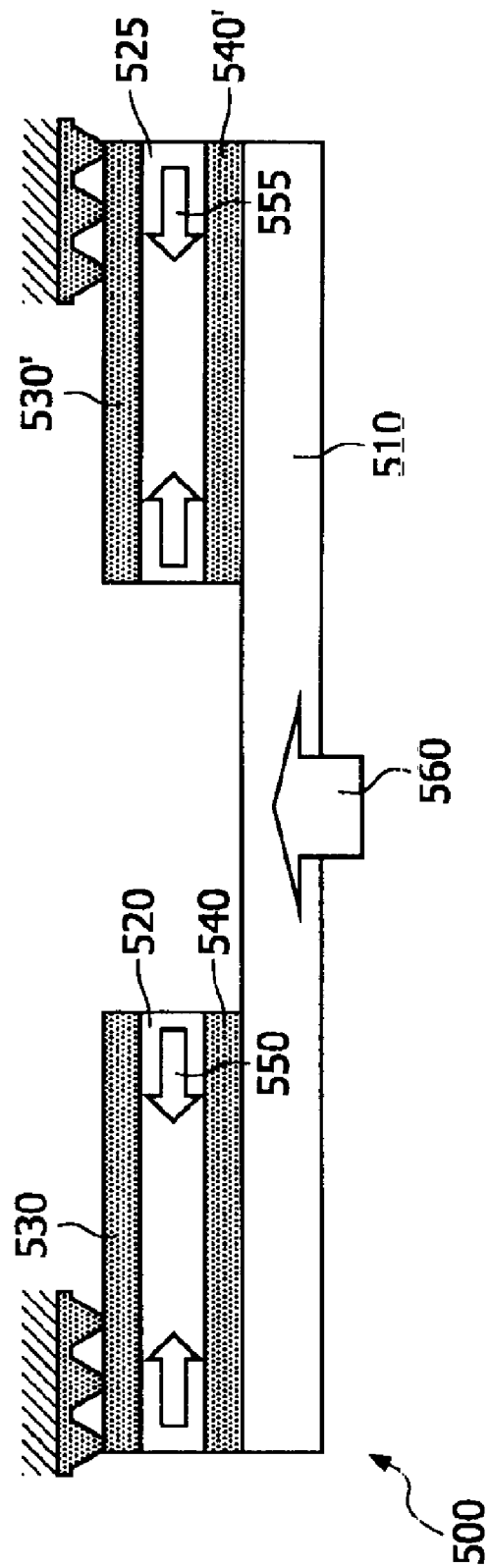
FIG. 5 shows a transducer having electrodes on opposite side according to one embodiment of the present system.

Of course, if desired the pair of electrodes, instead of being on one side, e.g., on the top side of the piezoelectric material, may be on both sides, e.g., to sandwich the piezoelectric material 520, 525, as shown in the sensor 500 of FIG. 5. In this case, voltage is provided across the top and bottom electrode pairs 530, 540 and 530', 540'. When the voltage difference between the top electrodes 530, 530' and the bottom electrodes 540, 540' is positive, contraction 550, 555 of the piezoelectric layer in plane and elongation perpendicular to the membrane result in pulling up the membrane stack, as shown by arrow 560.

The sensors 400, 500 are less expensive as they are formed efficiently and require less processing operation. For example, the wafer and membrane are not produced along the expensive SOI production but, as described in more detail in connection with FIGS. 8A-8C, may be silicon nitride, silicon oxide, or combinations of silicon nitride and silicon oxide which may be deposited using standard semiconductor processes and are less expensive. Of course, besides these materials, any other inorganic or organic compatible with the piezoelectric thin film processing may be used. Further, there may be no need to pattern the lower substrate 615 shown as dashed lines in FIG. 6, e.g., by patterned bulk micro-machining, and 2-side lithography, to remove portions of the substrate and create an opening 260, as described in connection with FIGS. 2A and 2B, in order to expose the membrane.

Rather, the sensor is mounted on a die and a full etch everywhere is performed to remove all the lower substrate 615. Thus, lithography or patterning is only on one side, e.g., to pattern the electrodes and/or piezoelectric material if desired. The other side, e.g., the bottom side shown in FIGS. 4A and 5, may require any lithography or patterning. Rather, a full etch may be performed to remove the lower or front end substrate 615 and expose the membrane 410, 510, 610 after mounting the sensor array or element on a die or back end substrate 640 as shown in FIG. 6.

Figure 8A:
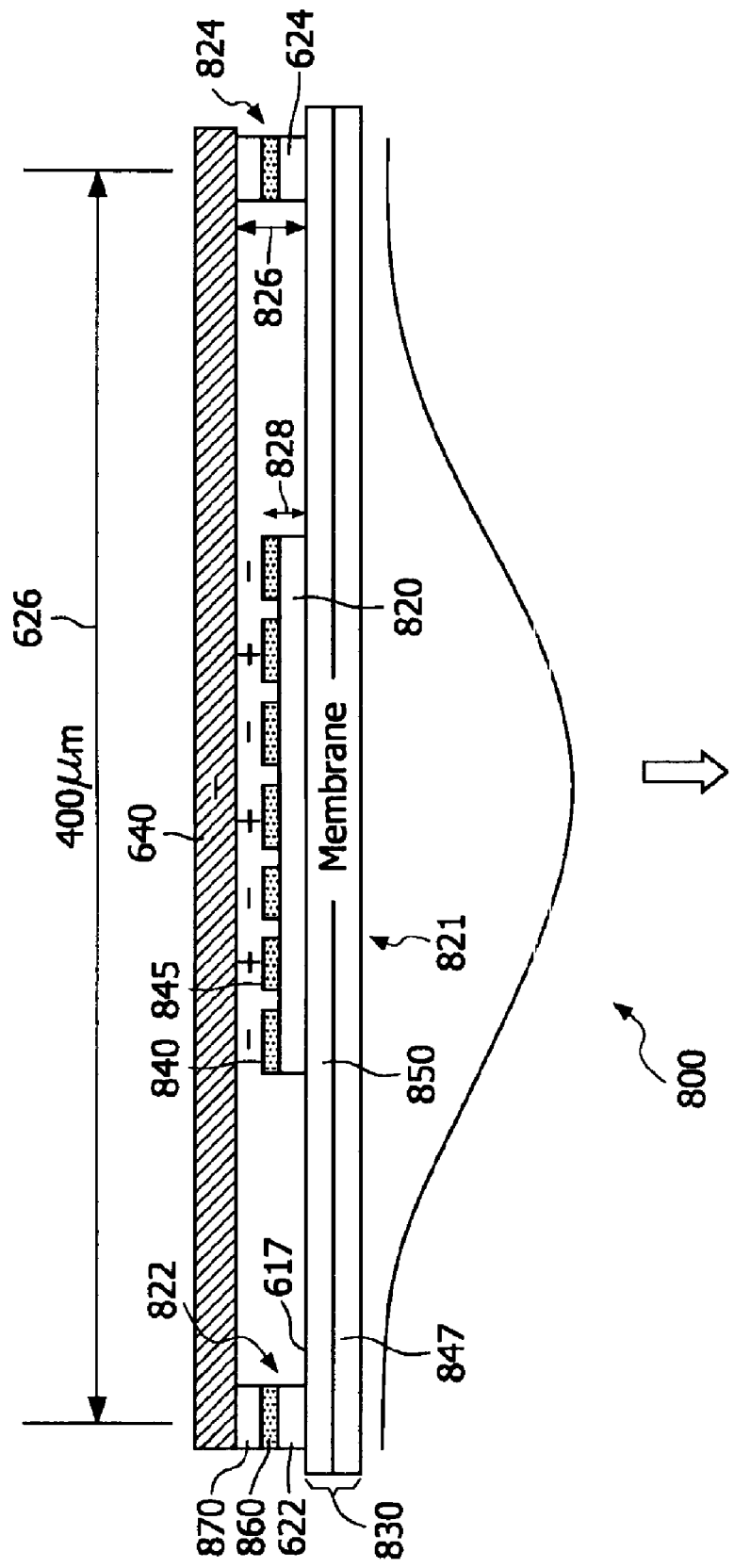
FIGS. 8A-8C show a transducer with a back substrate supported on mounts according to one embodiment of the present system.

Cost and production time are reduced not only because no patterned etching of the substrate is needed, but also because there is no need to align font-side and back-side masks to properly etch the desired portions of the substrate to obtain the opening 260 (FIGS. 2A, 2C) at the proper locations. This not only reduces processing time and costs but also increases yield by eliminating alignment errors and handling issues of fragile perforated substrates. Further, for the case where the electrodes are only on one side of the piezoelectric material, as shown in FIGS. 4A, 6 and 8A for example, one less layer is needed, namely, due to the lack of electrodes on the other side of the piezoelectric material, thus reducing production time and cost.

Figure 6:
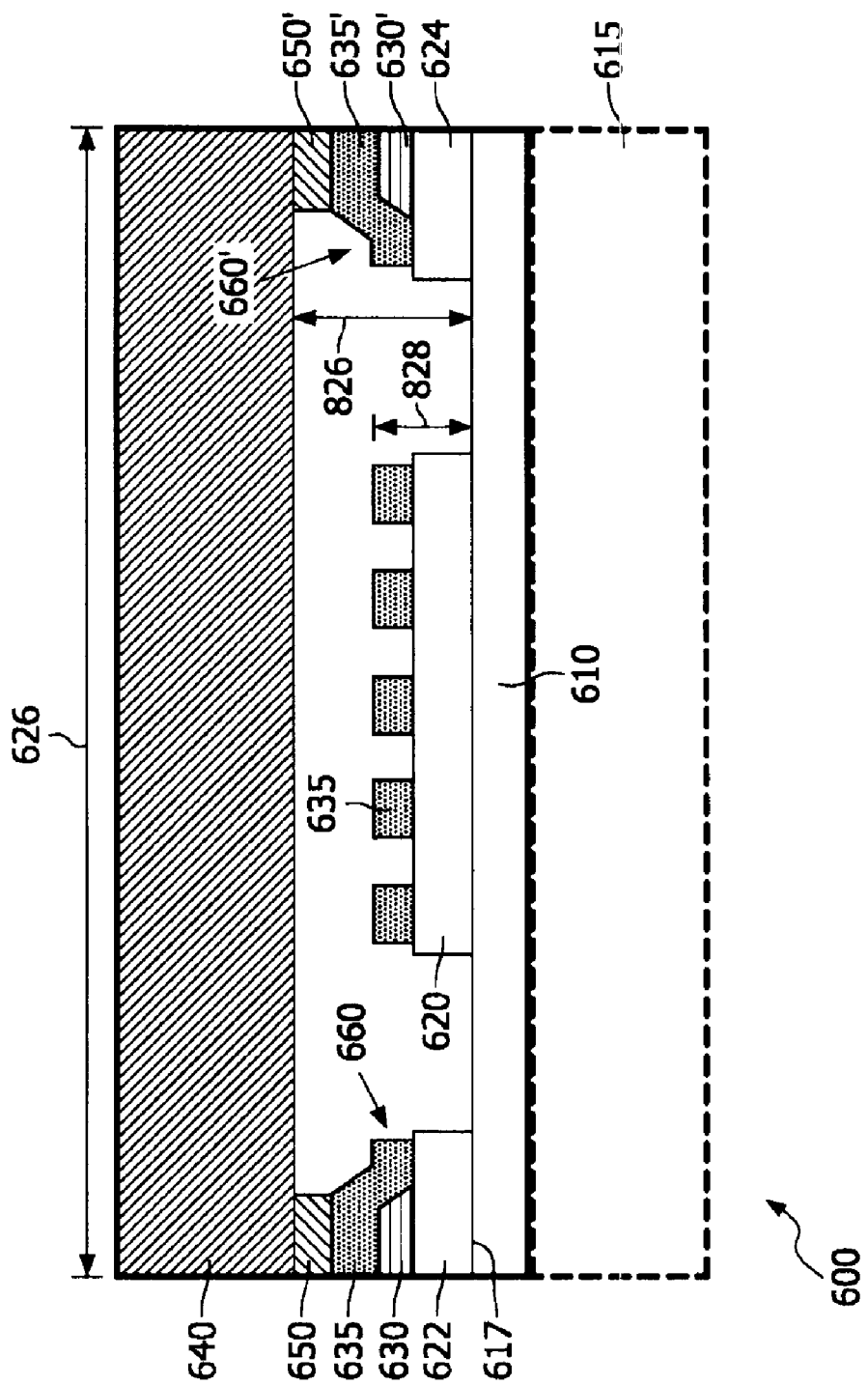
FIG. 6 shows an array of transducers with a back substrate according to one embodiment of the present system.

The basic module of the piezoelectric thin film transducers is a stack of thin film membranes, as shown by reference numerals 410, 510 in FIGS. 4A and 5A, respectively, and 610 in FIG. 6. Illustratively, the membrane 410, 510, 610 is formed from silicon nitride, silicon oxide, or combinations of silicon nitride and silicon oxide. The membrane 410, 510, 610 may be deposited for example in a low pressure chemical vapor deposition (CVD) process, for example, on a substrate 615 which is later fully etched away to expose one side of the membrane. The substrate may be silicon or any other suitable material. On top of the membranes 410, 510, 610, a thin film barrier layer 617 of, e.g., titanium oxide, zirconium oxide or aluminum oxide, may be applied as necessary, as shown in FIG. 6.

In the embodiment shown in FIG. 6 (which is related to the embodiment shown in FIG. 4A having electrodes on only one side of the piezoelectric layer), on top of the membrane layer 610 (410 in FIG. 4A) or on top of the barrier layer 617 when present, a piezoelectric thin film is formed, processed and patterned (if desired) to form the piezoelectric regions 620, 622, 624. Illustratively, the piezoelectric thin film may be lead titanate zirconate which is either undoped or doped with, e.g., La, but may be also any other piezoelectric material. The piezoelectric layer 620 may be continuous or patterned to match the width of the actuation section (402 in FIG. 4B). A plurality of the transducer element 600 may be arranged into a one or two dimensional array where the pitch of the elements may be as small as the width 626 of an element (also shown as reference numeral 330 in FIG. 3). The right and left piezoelectric regions 622, 624 shown in FIG. 6 have no piezoelectric function but serve as spacers or support mounts as will be described. The cavity with height 826 might be filled with gas or evacuated during the bonding process depending on application. For example, advantages of a gas filled cavity include providing better sealing, similar to a hermetic package for better reliability in harsh environments. Advantages of having a vacuum in the cavity include free movement of the membrane, especially for air transducers, but at the disadvantage of stiffer membranes. The cavity may also be left open to the environment to provide pressure equalization with the environment, thus reducing or avoiding of shifts or drifts in parameters, such as a shift in the resonance frequency, the sensitivity and the like. However, an open cavity may be more sensitive to moisture and the environment. The choice depends on the application environment.

Further, one or more metallization layers are applied on one side of the piezoelectric thin film and patterned to form the electrodes shown as strips 630 in FIG. 6. Illustratively, a first metal layer stack, which may be a thin TiW layer and an Al layer having a total thickness of approximately 1 μm for example, is formed and patterned to form a first set of electrode strips 630, 630', and a second metal layer is formed and patterned, over the first set of electrode strips 630, 630' to from a second set of electrode strips 635, 635'. It should be understood that a stack or layer as referred to herein may be a single layer or multi-layers of two or more materials formed in alternating layers, for example. The second metal strips 635, 635' may be a metal layer stack of a Ti layer and an Au layer having a total thickness of approximately 1 µm, for example. Of course, any suitable combination and types of metal(s), such as including only one metal stack from, e.g., a stack of Ti and Au, may be used to form the electrodes. Patterning of the piezoelectric thin film and metal layer(s) may be by any suitable method, such as well known lithographic method, using a photo-resist layer and etching, for example.

At opposing edges of each array element or piezoelectric region, the metal layer may be thicker and may include further metal layer(s) 650, 650' formed over the previously formed metal strip to increase the height of the peripheral metal strips and form support mounts 660, 660' having a height or thickness of approximately 200 nm to 2 µm or higher, e.g., up to 20 µm. The further metal layer(s) 650, 650' may also be Ti and/or Au or any suitable combination and types of metal(s).

As described in more detail in connection with FIGS. 8A-8B, the thickened end or peripheral metal layers (having the additional or further metal layer(s) 650, 650') also act as support mounts 660, 660' for mounting thereon the back-end substrate 640. In particular, on top of the device 600 shown in FIG. 6, namely, over the peripheral metal strip or support mounts 650, 650' at opposite edges of the piezoelectric regions 620, 622, 624 or array elements, the back-end substrate 640 is mounted by ultrasonic bonding using suitable contact metals such as Ti/Au, for example. Of course, any other bonding scheme may be used such as thermo-compression bonding, etc. The back-end substrate 640 may be silicon for example and mounted by any other bonding technique using any suitable adhesives, where the metal layer(s) 650, 650' and the second set of electrode strips 635, 635' both may be Au, which is also very suitable for ultrasonic bonding to each other.

The peripheral metal strips or supports 660, 660' where the back-end substrate 640 is mounted may have a thickness on the piezoelectric layer of 0.5-30 µm. Of course, instead of forming the further metal strips 650, 650' over the peripheral metal strips 635, 635' to increase their height, the further metal strips 650, 650' may also be applied on the back-end substrate 640 which is then mounted on top of the peripheral metal strip 635, 635', where simple metal (650) on metal (635) bonding is performed, where Au is suitable for both metal layers 650, 635 in case of ultrasonic bonding. Of course if desired, support mounts of desired height may be formed on the back-end substrate 640, where such support mounts of the back-end substrate 640 are bonded on top of the membrane 610 or a suitable layer formed over the membrane 610.

To achieve, if desired, a very large gap 826 between the back-end substrate 640 and the piezoelectric transducer region, in an alternative stack, grooves can be etched into the back-end substrate 640 in the region where the piezoelectric membrane 610 is actuating. In order to achieve this, after deposition and patterning of the metal regions 650 and 650', which can be for example a thin Ti and a Au layer on top of the back-end substrate 640 (which can be for example an Si substrate with a $SiO_2$ layer of for example 2 µm thickness), a dry etching process step for the $SiO_2$ and Si is applied in the regions where no Ti/Au is deposited. Besides dry etching procedures, also wet-etching techniques for SiO2 and Si may be applied. Patterning of $SiO_2$ and Si enables to achieve gaps between the piezoelectric transducer and the back-end substrate 640 of several micrometers up to several tens of micrometers.

The back-end substrate 640 may be a silicon substrate with or without integrated electronics, a glass substrate or any other substrate. The mounted back-end substrate 640 may also include Si devices with integrated electronics, transistors, passive elements and the like. Openings or vias may also be provided in the back-end substrate 640 to enable high element count interconnects for one and/or two dimensional arrays, for example.

The front or lower silicon substrate 615 carried underneath the transducer arrays shown by dashed lines 615 (over which the various layers, e.g., the membrane, barrier, piezoelectric and metallization layers are formed and patterned) is fully or partly etched away after forming and patterning the various layers, thickening the metallization regions at edges of the array elements and mounting thereon the back substrate 640. The front or lower silicon substrate 615 is fully or partly etched away by wet-chemical etching or dry etching or grinding and/or polishing or a combination thereof, for example. It should be noted that there is no need for any alignment or use of bulk-micromachining or lithographic etching of the front or lower substrate 615, since it is not patterned and rather is mainly fully removed in the active array area. That is, two-side lithography is not needed. This reduces production time and costs.

Figure 7:
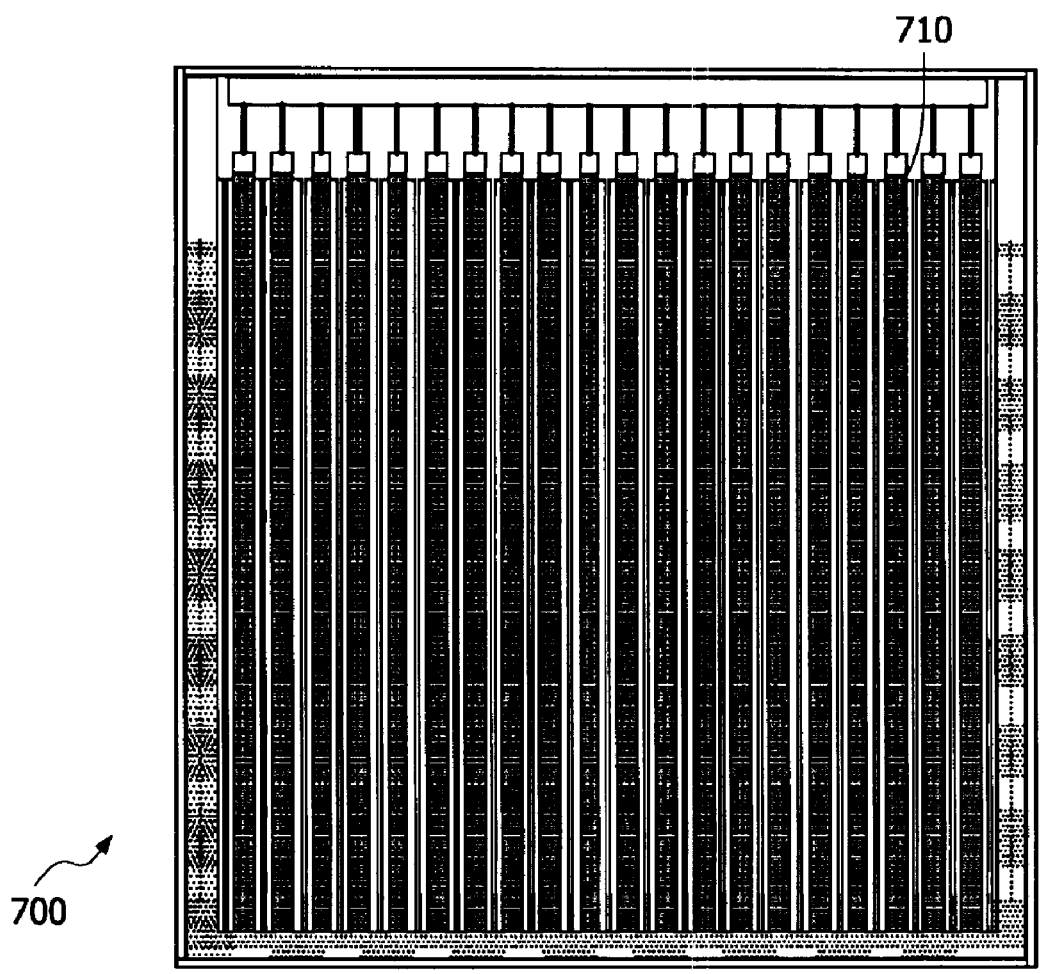
FIG. 7 shows an array of transducers having inter-digital electrodes according to one embodiment of the present system.

As described in connection with FIG. 3, a plurality of elements 310 may be provided in an array 300, which may range from one element to several tens to hundreds or even thousands of elements of the same and/or different size and/or shape. To operate the devices at frequencies of e.g. 50-450 KHz, the elements are designed with pitches in the order of several hundred micrometers to several thousand micrometers. An example of a design for a transducer array 700 operating at 200-300 KHz is shown in FIG. 7 where cross-sections of the elements 710 are shown in FIG. 8A. It should be understood that any other designs, which enables the efficient operation of the transducer at these low frequencies, e.g., circular shaped membranes or elements and any shaped array, are also possible.

To enable the operation at low voltages and still achieve the desired resonance frequencies of the devices of approximately in the range of 50-450 KHz, a transducer element 800 may have a pitch 626 of 400-1500 µm, as shown in FIG. 8A, which is the design associated with FIG. 4A where interdigital electrodes 840, 845 are formed on only one side of the piezoelectric layer 820, similar to the interdigital electrodes 250, 255 shown in FIG. 2B.

FIG. 8A also shows the membrane 830 over which the piezoelectric layer 820 is formed and patterned to form a central active region 821 over which electrodes 840, 845 with an interdigital layout are applied. Making use of a very small spacing between the interdigital electrodes 840, 845 and the increased number of interdigital electrodes, a low voltage operation may be achieved.

Piezoelectric material 622, 624 also remains at the peripheral regions 822, 824 over which the metallization layer is formed, which is patterned to form the electrode 840, 845, and first metal region 860 over the piezoelectric peripheral regions 622, 624. A second metallization layer 870 is formed over the first metal region 860, using the same or different metal (as also described in connection with FIG. 6). The second metallization layer 870 increases the thickness or height 826 (or 826' in FIG. 8B) of the peripheral regions or support mounts 822, 824 beyond the thickness or height 828 (or 828' in FIG. 8B) of the piezoelectric layer 820 and electrodes in the active region 821. The transducer elements are mounted, e.g., clamped by adhesive, ultrasonic bonding, or thermal compression bonding to the top or back-substrate 640.

An array (700 in FIGS. 7 and 300 in FIG. 3) of transducer elements may be formed configured for scanning and beam steering where the elements, having a pitch 320 (FIG. 3) of 400-800 µm, may be connected in parallel, for example. As described in connection with FIGS. 4A and 4B, the membrane 830 includes a silicon nitride layer 847 formed over the front or lower substrate (which is later removed as shown by the dashed lines 615 in FIG. 6), and a silicon oxide layer 850 formed over the silicon nitride layer 847, or combinations of silicon nitride and silicon oxide layers.

As described, a voltage signal is applied to the interdigital electrodes 840, 845 to provide different sign (or polarity) voltages on adjacent electrodes thus creating an in-plane electric field between the electrodes 840, 845 thus exciting the piezoelectric layer 820 into a longitudinal oscillation in the plane of the piezoelectric layer 820. The change in length of the piezoelectric element excites the membrane 830 into oscillation.

Of course, instead of the design where electrodes are provided on one side of the piezoelectric layer, the electrodes may be provided on both sides of the piezoelectric layer, as described in connection with FIG. 5, and shown in FIG. 8B where the patterned piezoelectric layer or regions 820' are sandwiched between two opposing electrodes 840', 845'. In this case, the piezoelectric layer 820' is patterned into regions matching the patterned opposing electrodes 840', 845'.

Figure 8B:
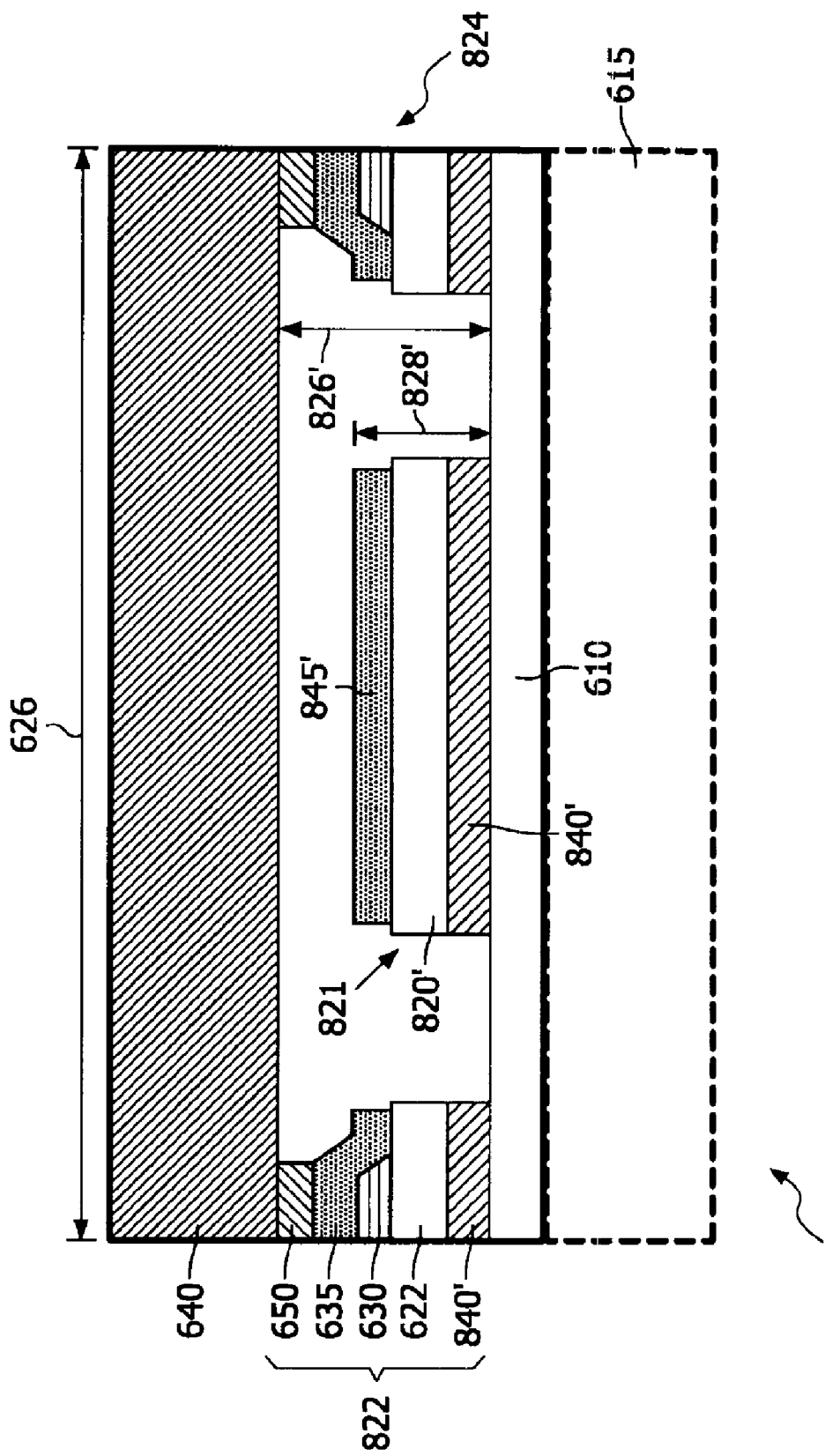

In the embodiment shown in FIG. 8B, the piezoelectric layer 820' is covered from both sides with a pair of complementary electrodes 840', 845' for applying a voltage across them. Of course, one of the electrodes in either embodiment shown in FIG. 8A or 8B may be grounded. Illustratively, the bottom electrode 840' for example is a Ti/Pt electrode and the top electrode 845' is a Ti/Au electrode. Of course any other electrode material compatible with the piezoelectric layer may be used.

Figure 8C:
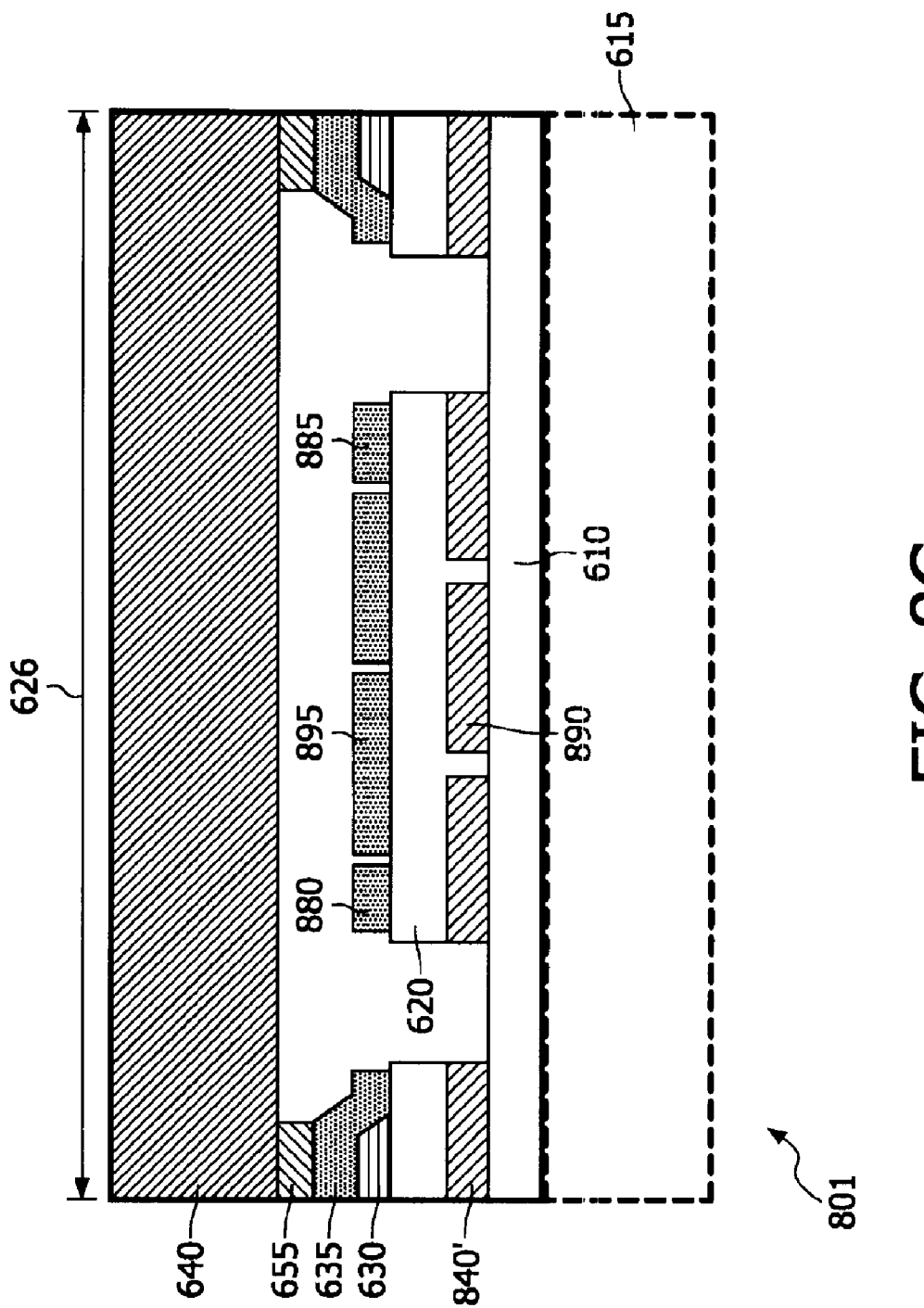
Figure 8D:
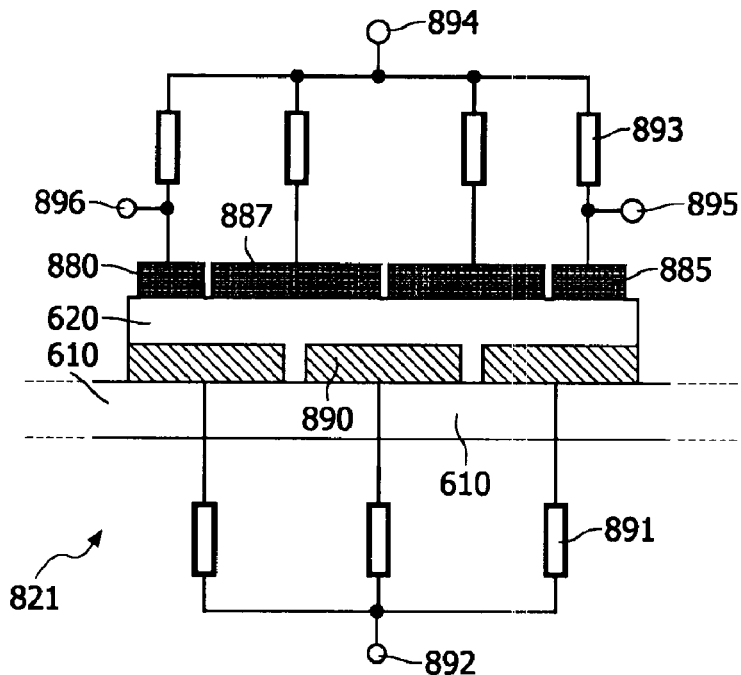
FIG. 8D shows a resistive biasing network according to one embodiment of the present system.

The design may be tailored to match the electrical impedance of the driving electronics by using a series connection of actuation regions as shown in FIG. 8C depicting a transducer 801 according to another embodiment. Such a design also may use thinner electrodes with still tolerable ohmic losses. A signal voltage may applied between peripheral top electrodes 880, 885 which may be made to better conduct by adding an extra metal layer 630 without hampering the bending mode of the membrane. Overlapping electrodes 890, 895 on opposite sides of the piezoelectric layer 620 may be floating or connected to an external small-leakage voltage divider, e.g., a chain of high-value resistors. In FIG. 8C, the active portion of the piezoelectric layer 620 is divided in segments that are connected in series by capacitive coupling between the overlapping bottom and top electrodes 890, 895. Yet another alternative (also valid for all examples) is to apply DC bias voltages to enhance piezoelectric coupling as shown in FIG. 8D. The bias voltage may be provided to the elements 880, 885, 887, 890 by the ports 892, 894 via the resistors 891,893. An input signal may be also be provided, e.g., via ports 895, 896. In this way also, electrostrictive materials can be used as the active layer 620 or the bias connections may be used for poling of the piezoelectric material.

Figure 9:
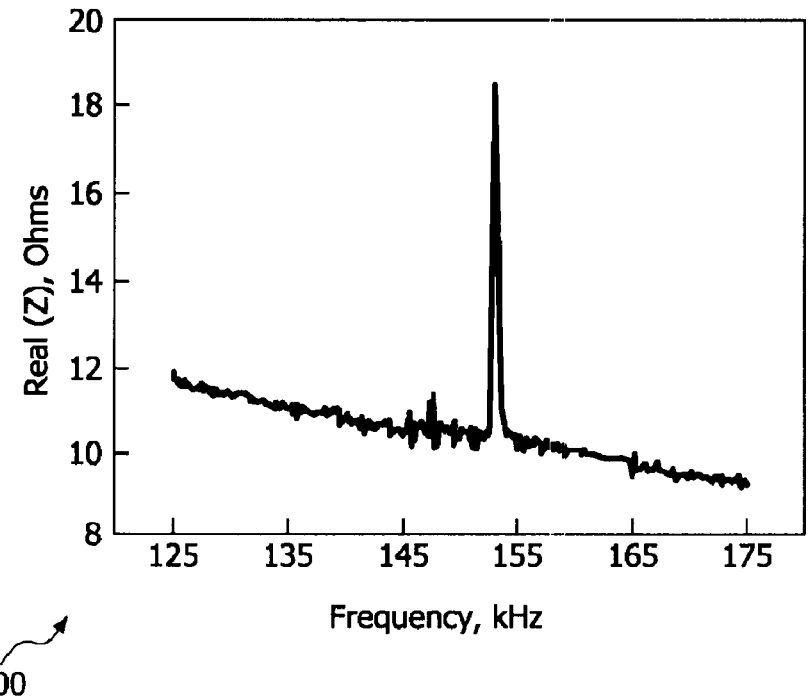
FIG. 9 shows a plot of electrical impedance versus frequency of a transducer according to one embodiment of the present system.

Such thin film transducer arrays may operate at frequencies of 50-450 KHz as is shown in the plot 900 of FIG. 9 for a free standing thin film piezoelectric transducer membrane, where the x-axis is frequency, and the y-axis is the real part of the electrical impedance.

Various modifications may also be provided as recognized by those skilled in the art in view of the description herein. For example, actuation electrodes may form a single plate capacitor in the center or at the edges of the membrane. Alternatively, the single plate capacitor may be divided into smaller areas that may be connected in a series configuration to match the operation voltage of the driving circuit. Each of the above transducers, sensors and systems may be utilized in conjunction with further systems.

Further, various material may be used for the different layers, as described in U.S. Pat. Nos. 6,515,402, 6,548,937, WO 03/092915 to Klee et al., and WO 03/092916 to Fraser et al., assigned to the assignee hereof, the content of each of which is incorporated herein by reference in its entirety. For example, the barrier layer(s) may be formed from one or more of the following: $TiO_2$, $Al_2O_3$, $HfO_2$, MgO and/or $ZrO_2$. The piezoelectric thin film materials may include:

1. $PbZr_xTi_{1-x}O_3$ ($0 \leq x \leq 1$) with and without doping. The doping may comprise La, Mn, Fe, Sb, Sr, Ni or combinations of these dopings.

2. $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(K_{1-x}Na_x)NbO_3$ ($0 \leq x \leq 1$), $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0 \leq x \leq 1$), $a(Bi_xNa_{1-x})TiO_{3-b}(KNbO_{3-c})$ $\frac{1}{2}(Bi_2O_3$—$Sc_2O_3)$ ($0 \leq x \leq 1$, $a+b+c=1$), $(Ba_aSr_bCa_c)Ti_xZr_{1-x}O_3$ ($0 \leq x \leq 1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ Further, the various stacks or layers forming the support mounts 822, 824 (as shown in FIG. 8B, for example,) may be formed over one or both the piezoelectric layer 622 and the back substrate 640. For example, two metal layers 630, 635 may be formed on the piezoelectric layer 622 and one metal layer 650 may be formed on the back substrate 640, for bonding the second metal layer 635. Alternatively or in addition, the first metal layer 630 may be formed on the piezoelectric layer 622 and two metal layers 650, 635 may be formed on the back substrate 640, where the second metal layer 635 is bonded to the first metal layer 630.

The various stacks or layers that form the support mounts (e.g., support mounts 822, 824, shown in FIG. 8B) may include one or more of the following materials, where the first metal layer 630 is formed over the piezoelectric layer 622, and the second metal layer 635 is formed over the first metal layer 630. The further metal layer 650 is formed on the back substrate 640 as shown in Table 1. For example, the first row of Table 1 shows an embodiment where a Ti layer is formed over the piezoelectric layer 622, and an Au layer is formed over the Ti layer, where the Ti and Au layers form the first metal layer 630. Another Au layer is formed as the second metal layer 635 over the Au layer of the first metal layer. On the back substrate 640, a Ti layer is formed. Over this Ti layer an Au layer is formed, where these Ti and Au layers form the additional or further layer 650 on the back substrate 640. Next, the Au layer of the further layer 650 is bonded to the Au layer of the second metal layer 635.

TABLE 1

| First metal layer 630 (formed over the piezoelectric layer 622) | Second metal layer 635 (formed over the first metal layer 630) | Further metal layer 650 (formed over the back substrate 640) |
|---|---|---|
| Ti Layer + Au Layer | Au layer or Ti Layer + Au layer | Au layer + Ti layer |
| Cr Layer + Au Layer | Au layer or Cr Layer + Au Layer | Au layer + Cr layer |
| Cu layer + Ni Layer | Au layer | Au layer + Ni layer |
| TiW layer + Al layer | Ti layer + Au layer | Au layer + Ti layer |

TABLE 1-continued

| First metal layer 630 (formed over the piezoelectric layer 622) | Second metal layer 635 (formed over the first metal layer 630) | Further metal layer 650 (formed over the back substrate 640) |
|---|---|---|
| Ti Layer + Au Layer | Sn layer | Sn layer + Au layer + Ti layer |
| Ti layer + Pt layer | Au layer | Au + Pt + Ti |

Of course, any other metals and combinations of metal stacks may be used to form the various layers. Further, instead of only forming the further layer 650 on the back substrate 640, the second metal layer 635 may also be formed on the further layer 650 (instead of being formed over the first metal layer 630). After forming the stack of layer 650, 635 on the back substrate 640, then the second metal layer 635 may be bonded to the first metal layer 630 formed over the piezoelectric layer 622. In this case, the second metal layer 635 will overlap the further layer 650 (instead of overlapping the first metal layer 630 as shown in FIGS. 6 and 8B, for example). Table 2 shows various embodiments of the layers in the case where the further layer 650 is formed on the back substrate 640, and the second metal layer 635 is formed on the further layer 650.

TABLE 2

| First metal layer 630 (formed over the piezoelectric layer 622) | Second metal layer 635 formed over the further metal layer 650 (which is formed over the back substrate 640) |
|---|---|
| Ti Layer + Au Layer | Thick Au layer + Ti layer |
| Cr Layer + Au Layer | Thick Au layer + Cr layer |
| Cu layer + Ni Layer + Au Layer | Thick Au layer + Ni layer |
| Ti layer + Au layer | Thick Au layer + Ti layer + Al layer + TiW layer |
| Ti Layer + Au Layer | Sn layer + Au layer + Ti layer |
| Ti layer + Pt layer + Au layer | Au layer + Pt layer + Ti layer |

It should be noted that, as shown in Table 2, instead of forming a first Au layer at one of the layers of the further layer 650 and then forming a second Au layer (over the first Au layer) as the second layer 635, a singly thick Au layer may be formed over the Ti layer (of the further layer 650) which is formed on the back substrate 640. As in the case for the first row of Table 1, in the embodiment shown in row one of Table 2, a Ti layer is formed over the piezoelectric layer 622, and an Au layer is formed over the Ti layer to form the first layer 630, which is then bonded to the thick Au layer of the formed on the Ti layer of the back substrate 640. Of course, and any other metals and combinations of metal stacks may also be used to form the various layers noted in Table 2.

In certain application, different shapes of transducer arrays are desirable. For example, U.S. Patent Application Publication No. 2007/0013264 to Wilser, which is incorporated herein by reference in its entirety, describes a capacitive membrane ultrasound transducer array formed on slabs of carrier substrates of semiconductor material. Two slabs of substrate are separated or connected by a thinner substrate bridge which allows bending. The separated or thinly connected slabs may be positioned along a rigid curved surface resulting in a curved array. The slabs are connected by conductive interconnects that is flexible enough to withstand the degree of curvature. Although a desired shape is achieved by placing the slabs over curved surfaces, the thin bridges or conductors that connect the slabs are fragile. Further, the curved surfaces themselves are rigid and not flexible.

In one embodiment of the present devices and systems, an improved or a truly flexible array of transducers is provided which is better protected and may be formed to a desired shape by itself without the need for rigid surfaces. For example, the array 300 shown in FIG. 3 may include at least one thin film flexible ultrasound transducer, configured as at least one omni-directional motion and presence detector. Instead of, or in addition to the flexible ultrasound transducer(s), at least one thin film flexible pyroelectric sensor may be also provided. The combination of flexible ultrasound and pyroelectric sensors provides less false off's or false alarms, taking advantage of two types of sensors, namely, pyroelectric and ultrasound sensors where the pyroelectric sensor(s) are based on detection of temperature change, e.g., using infrared (IR) signals (that have the disadvantage of needing a line of site for IR signal detection), and where the ultrasound sensor(s) detect ultrasound signals around barriers and do not need a direct line of sight.

Flexibility of the array of ultrasound and/or pyroelectric transducers enables realization of arrays in various shapes. Such flexible transducer arrays may be formed and mounted in any desired shape, e.g., a cone shape on the ceiling. This enables omni-directional transmission and detection of ultrasound and/or IR signals.

Figure 10:
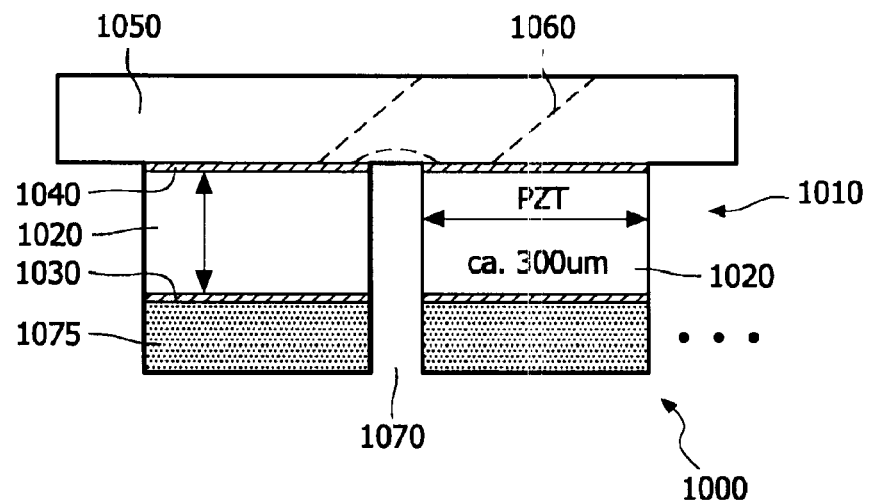
FIG. 10 shows two ultrasound transducers that form a flexible array of transducers on a flexible foil with interconnects according to one embodiment of the present system.
Figure 11:
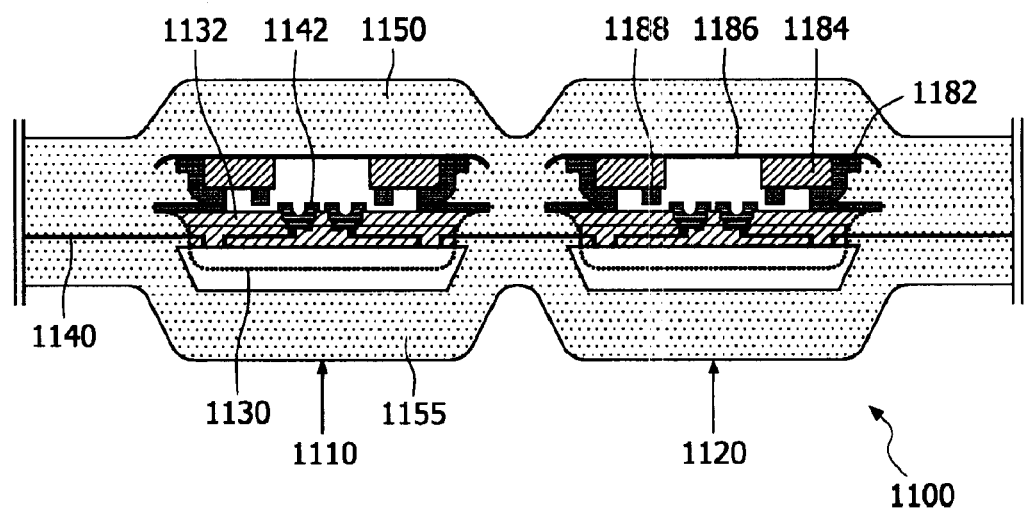
FIG. 11 shows two ultrasound transducer devices covered on both sides with a flexible layer interconnects that form a flexible array of transducers with the thin film piezoelectric elements on the upper side, mounted on silicon parts with or without electronics according to one embodiment of the present system.
Figure 12:
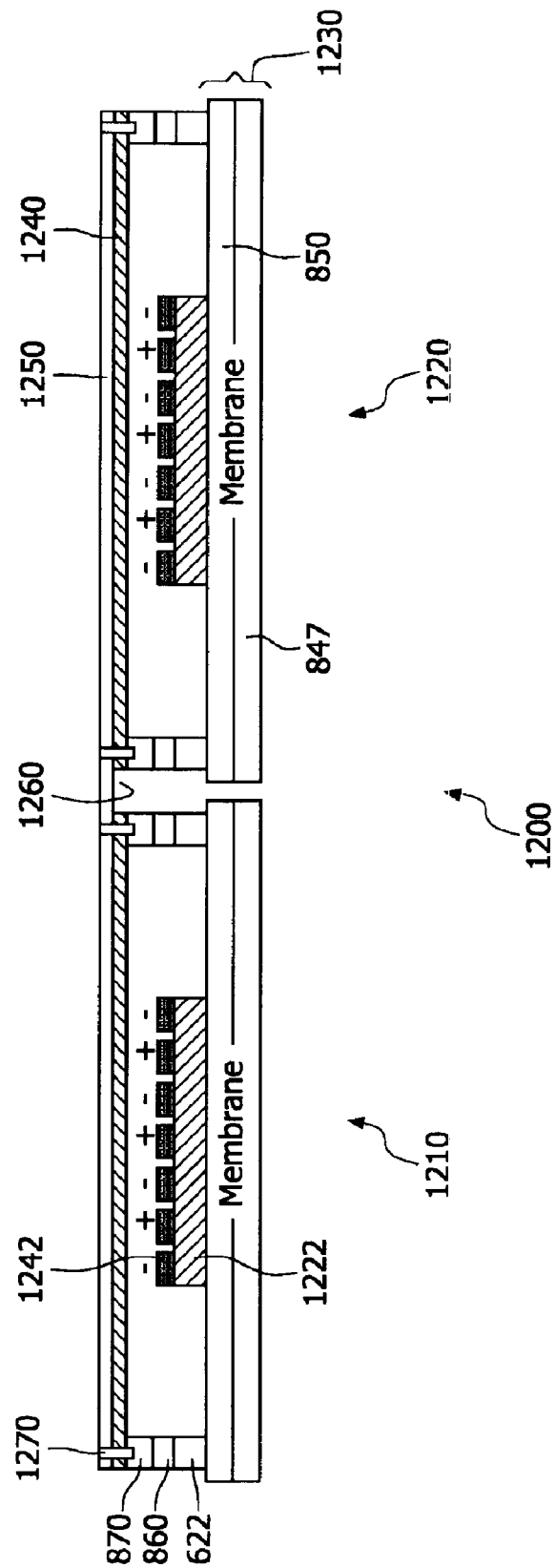
FIG. 12 shows a flexible array of two or more ultrasound transducers according to one embodiment of the present system.

Embodiments including a flexible array of transducers of any type of transducer, may be realized, such as ceramic piezoelectric elements as shown in FIG. 10, and/or thin film transducers as shown in FIGS. 11-12, for example.

In particular, FIG. 10 shows one embodiment of a flexible array 1000 of transducers 1010 comprising ceramic piezoelectric elements having a layer of piezoelectric material 1020 sandwiched between two electrodes 1030, 1040. Of course, if desired, the electrodes may be located on only one side of the piezoelectric material 1020, similar to that described above, such as in connection with FIGS. 2A, 4A, 6 and 8A.

As shown in FIG. 10, the transducers 1010 are mounted as an array, e.g., of columns and row, on a flexible carrier 1050 comprising interconnection shown as dashed lines 1060 which may be wirebonds or patterned conductive paths. The interconnection 1060 interconnect the electrodes to each other or to other elements as desired, such as for connection to power sources, electronic circuits, controller, transistors, switches, passive or active devices and the like. The flexible ultrasound transducer array 1000 enables realization of sensors having any desired shape for omni-directional motion detection that may include thin film ultrasound and/or pyroelectric transducers. The transducers 1010 need not be flexible, and may simply be mounted, such as bonded, to the flexible foil 1050, separated by a gap 1070 that allows movement of the flexible foil 1050 and enable shaping the array 1000 to any desired shape.

It should be noted that the transducers 1010 in the embodiment shown in FIG. 10 do not include a membrane and the piezoelectric slabs 1020 are not meant to bend the flexible carrier 1050. The transducer array 1010 is flexible due to the flexible carrier 1050, but the stiffness of the flexible carrier 1050 is typically too low to act as a good membrane. However, if desired, symmetry break(s) may be introduced during manufacturing, e.g., pre-bending, so that the in-plane stress is converted to bending. Further, an optional matching layer 1075 may be provided one the lower electrode 1030 shown in FIG. 10, such as for broad-band operation if the acoustic impedances do not match, e.g., piezoelectric material 1020 is harder than water or air. In addition, layers with intermediate stiffness may be provided to increase the bandwidth and facilitate energy transfer. Of course, a mechanical transformer may also be used, such as bending membranes.

FIG. 11 shows another embodiment of an array 1100, where two ultrasound transducer devices are shown having thin film piezoelectric elements on the upper side, mounted on silicon parts with or without electronics. The ultrasound transducer devices are covered on both sides with a flexible layer shown as reference numerals 1150, 1155. The flexible piezoelectric ultrasound transducer array 1100 is realized by thin film processing as described. In FIG. 11, the two thin film piezoelectric ultrasound transducer elements are shown as reference numerals 1110, 1120. Of course, any desired number of transducer elements may be included in an array in any desired configuration or topology, such as having equal or different number of columns and rows, for example. Thin film processing may be applied to realize flexible ultrasound transducer array. Alternatively, or in addition, a flexible capacitive micro-machined ultrasound transducer array may also be realized. The same technology described above in connection with thin film flexible ultrasound detectors may be used to realize thin film flexible pyroelectric detectors.

In particular, the embodiment of a flexible array 1100 shown in FIG. 11 comprises thin film ultrasound transducers, where two transducers 1110, 1120 are shown. The transducers 1110, 1120 are surrounded on both sides by first and second flexible layers 1150, 1555. FIG. 11 shows a flexible transducer array 1100 with the two transducers 1110 and 1120, comprising semiconductor parts such as silicon (Si) parts 1130 with or without integrated electronics, and interconnect structures 1132 embedded in dielectric layers on top of the Si parts 1130. The interconnecting lines 1140 for the different transducer elements 1142 comprise a redistribution interconnect layer, e.g., based on electroplated gold (Au). A thin film membrane 1186 may be provided comprising silicon nitride and/or silicon oxide, for example. On the membrane 1186, a piezoelectric thin film layer 1184 may be formed 1184. A metallization layer 1182 comprising titanium (Ti) and/or Au, for example, may be applied to form a contact to mount the piezoelectric part 1184 on the Si part 1130 by ultrasonic bonding, for example. This contact 1182 may be also act as a ground contact. Further metal contacts 1188 may also be formed comprising, for example, Ti and/or Au layer on top of the piezoelectric layer 1184 and used as signal line. Of course, the embodiment shown in FIG. 11 is one option for connection of ground and signal lines to drive the piezoelectric elements but also other ways of connections are possible, as it would be apparent to those skilled in the art in view of the present description.

In addition to being flexible, the thin film ultrasound transducers array 1100 are also protected by the two flexible foils 1150, 1555 on both sides of the array. Of course, in addition or instead of thin film ultrasound transducers, pyroelectric transducers may be used.

FIG. 12 shows another embodiment of a flexible array 1200 of two or more ultrasound transducers 1210, 1220, where each transducer may be similar to the ultrasound transducer 800 described in connection with FIG. 8A, for example. As shown in FIG. 12, the back substrate 1240 of each ultrasound transducer 1210, 1220 is attached, e.g., bonded, to a flexible foil or polymer layer 1250. The back substrate 1240 may be any suitable substrate, e.g. glass or and semiconductor material such as silicon (Si), and may be not only a carrier but also may include active and/or passive elements, such as transistors, switches, amplifiers, and desired electronics for control and operation of the transducers.

It is noteworthy that the back substrates 1240 of the two transducers 1210, 1220 are not connected to each other directly. Rather, the back substrates 1240 are connected by the flexible polymer layer 1250 thus providing flexibility to the transducer array 1200, which may be formed into any desired shape.

It should also be noted that, in comparison to a transducer configured for use in a non-flexible array, such as the transducer 800 shows in FIG. 8A, the transducers 1210, 1220 have a thinner back substrate 1240. Transducer elements such as membrane(s) 1230, piezoelectric layer 1222 and electrodes 1242 are mounted on the thin back substrate 1240, which may be a thinned down Si substrate, for example. The reduced thickness of the back substrate 1240 and separation or gap 1260 between substrates 1240 of the transducer 1210, 1220 improve flexibility of the array 1200.

In the Si substrate 1240, isolated vias 1270 may be formed for interconnection of the transducers 1210, 1220 to various elements including power sources and ground. Various elements as needed, such as passive and active elements, circuits, etc., could be processed in the back substrate 1240 or in or on the flexible foil 1250, which comprises multi-level interconnects for signal and ground connection. To realize a flexible device, the membranes 1230 between the various transducers 1210, 1220 are separated. Instead of, or in addition to the flexible ultrasound transducers, pyroelectric flexible thin film sensors may be also formed. It should be noted that all the different technologies shown above may also be used to realize combinations of arrays of flexible ultrasound transducers and pyroelectric sensors.

FIG. 12 also shows support mounts 822, 824 as described in connection with FIG. 8A, where the support mounts 822, 824 may be formed over the piezoelectric region 622 and include two metal layers 870, 860 which are similar to those described in connection with FIG. 8A, for example, as well as similar to the two metal layers 630, 635 shown and described in connection with FIG. 6. Of course, further metal layers may also be included in the support mounts 822, 824 such as the additional metal layers 650 shown and described in connection with FIG. 6, for example.

It should also be noted that the membrane 1230 shown in FIG. 12 may include various layers, such as a silicon nitride layer 847 formed over the front or lower substrate (which is later removed as shown by the dashed lines 615 in FIG. 6), and a silicon oxide layer 850 formed over the silicon nitride layer 847, or combinations of silicon nitride and silicon oxide layers, as shown and described in connection with FIG. 8A. Of course, any other combination of membrane layers comprising oxides, nitrides or stacks of oxides or stack of oxides and nitrides may be used.

In another embodiment of the above flexible transducers, also a very thin back-substrate 1240, which may be for example a 50 µm thin Si substrate where dielectric layers and interconnects may be mounted. This very thin substrate 1240 may then operate as a flexible substrate, so that no additional flexible layer 1250 is needed.

Further embodiments include a combination of at least one piezoelectric thin film ultrasound transducer and/or an array of piezoelectric transducers, with at least one thin film pyroelectric sensor and/or an array of pyroelectric sensors for detecting infrared radiation (IR), which may have various applications such as for motion and/or presence detection. Both ultrasound and pyroelectric transducers may be formed as thin films, using similar processes, and may be formed simultaneously or concurrently together. Piezoelectric material may be used for both generation/transmission and reception/detection of ultrasound and IR signals. Of course, also, different piezoelectric and pyroelectric materials may be applied. The following figures below show different illustrative embodiment of combined thin film ultrasound and pyroelectric detectors.

Figure 13A:
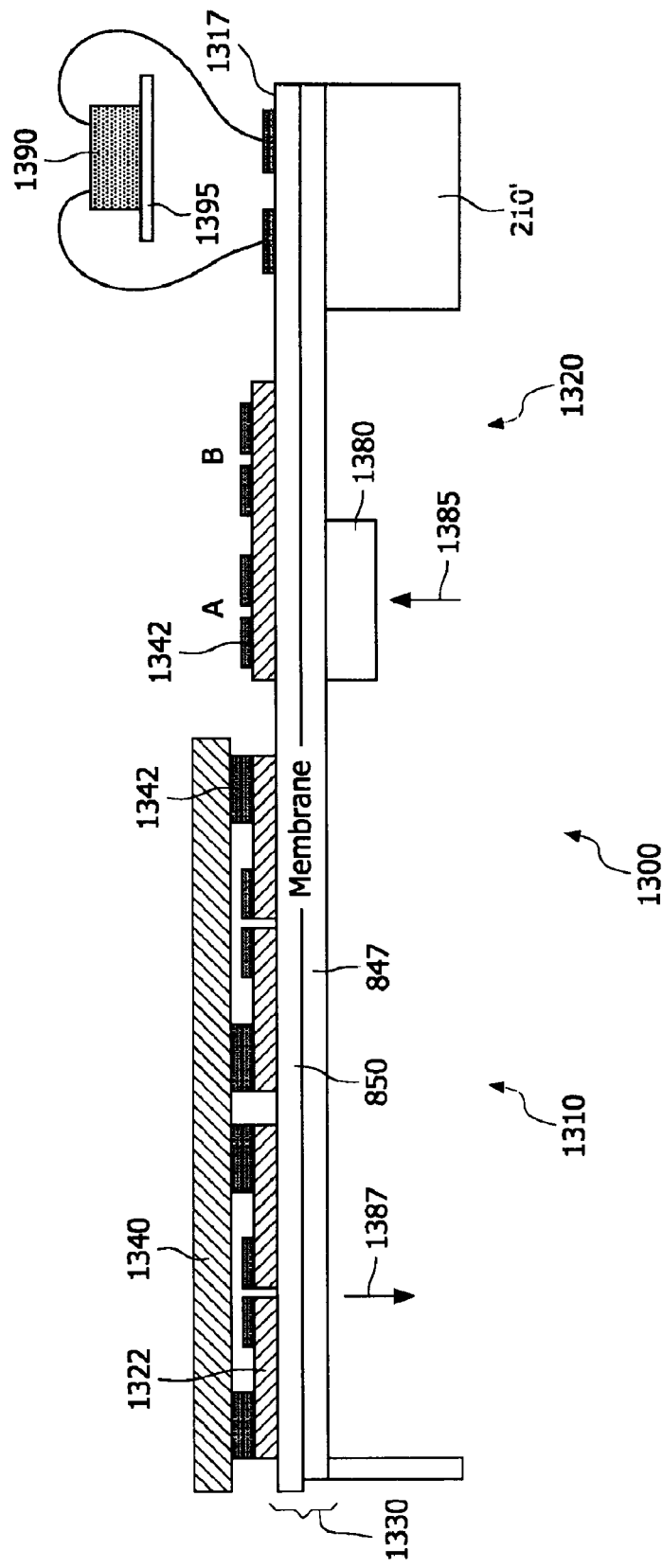
FIGS. 13A-13C shows arrays including a combination of an ultrasound transducer and a pyroelectric transducer with separately mounted circuitry on a board according to one embodiment of the present system.

FIG. 13A shows an array 1300 including a combination of an ultrasound transducer 1310 and a pyroelectric transducer 1320. Of course, instead of being arranged in an array, the combined ultrasound and pyroelectric transducer may be a stand alone detector or used with other detectors in any desired configuration. The ultrasound and/or and pyroelectric transducer, as single element or as array of elements, is processed on top of the membrane 1330, which may be for example silicon nitride or silicon oxide, or a combination of silicon nitride and oxide. FIG. 13A shows a silicon oxide layer 850 formed over a silicon nitride layer 847, as also described in connection with FIGS. 8A and 12. Of course, in this and other embodiments, any other membrane material such as Si or combinations of membrane stack of Si and silicon oxide (e.g., $SiO_2$) may also be used. The advantage of a silicon oxide nitride layer is the low specific heat and the low thermal conductivity, which increases the thermal time constant of the pyroelectric device, which is the time, by which a temperature enhancement delta T relaxes to its background value.

Figure 13B:
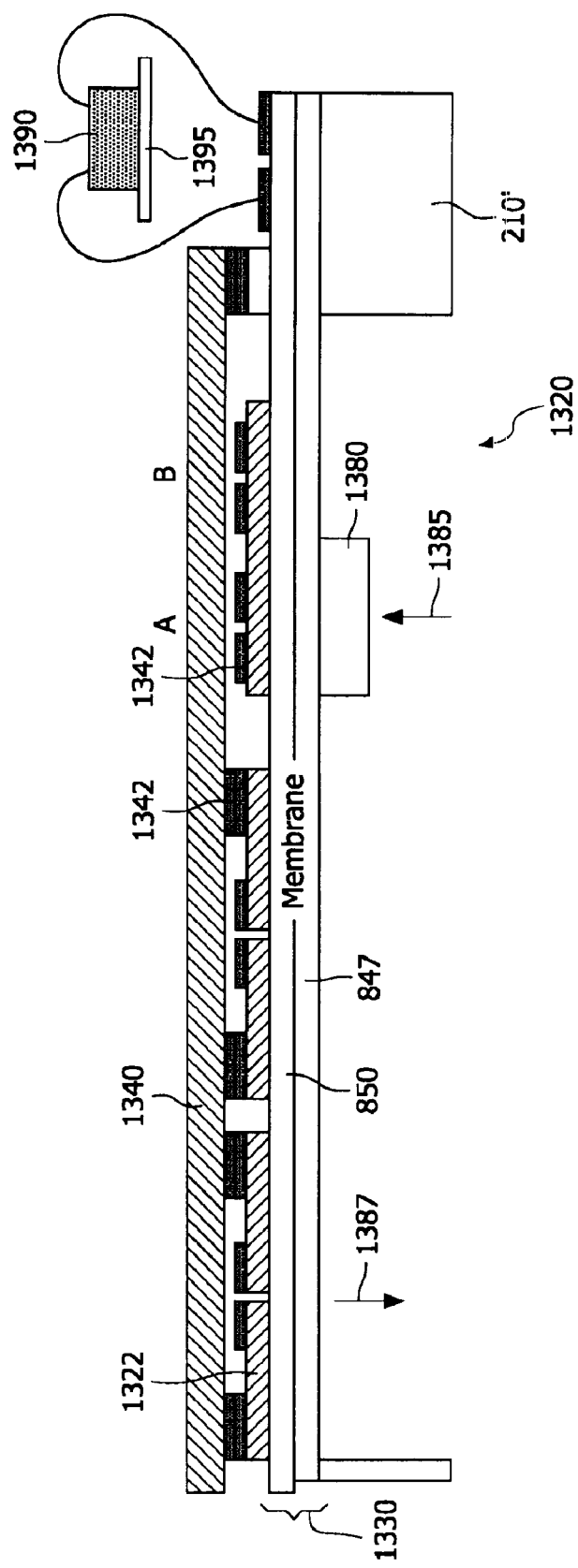
Figure 13C:
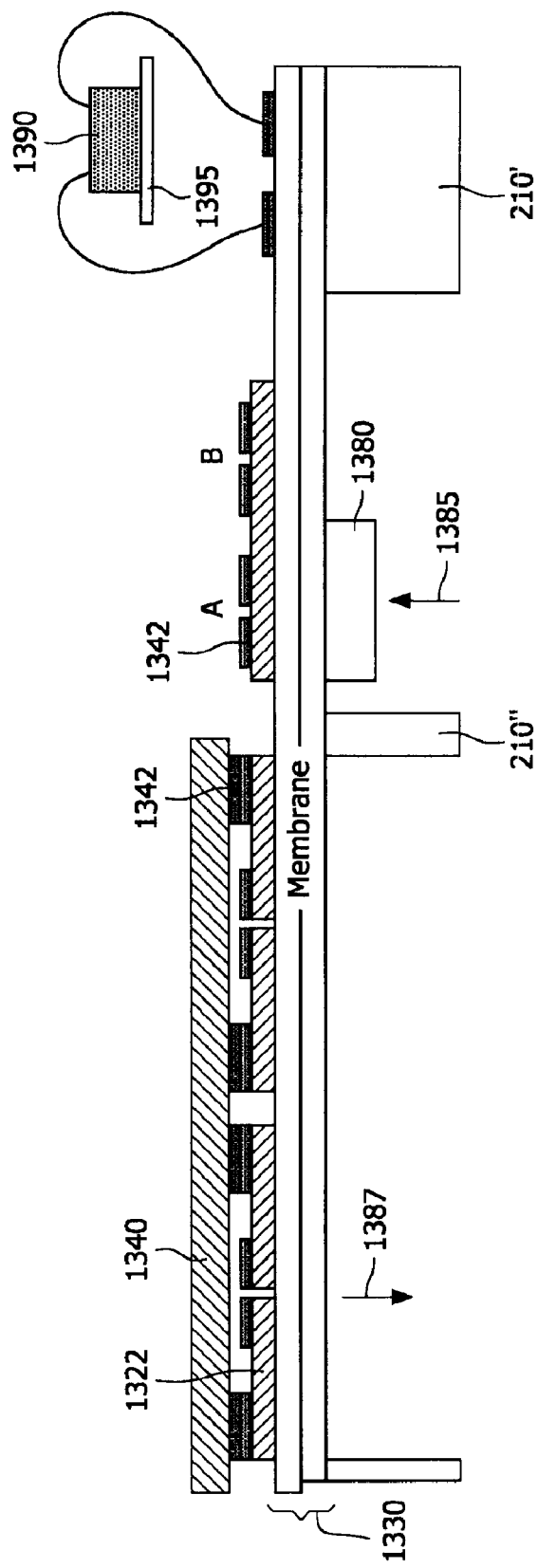

The integration of the thin film ultrasound transducers 1310 next to the pyroelectric detector 1320 can be carried out in different versions. For example, the back substrate 1340 may only be mounted on the transducer part as shown in the FIG. 13A. In alternative technologies with the aim to mechanically stabilize the large membrane, which comprises the integrated ultrasound transducer 1310 and the pyroelectric detector 1320, the mounted back substrate 1340 may also cover the pyroelectric detector 1320 as shown in the FIG. 13B, where both the integrated ultrasound transducer 1310 and the pyroelectric detector 1320 are covered with the back substrate 1340. Alternatively or in addition, to stabilize the large membranes of integrated ultrasound transducers 1310 and pyroelectric detectors 1320, the Si substrate 210' underneath the membrane 1330 (e.g., the silicon nitride membrane) may partly remain in the areas between the ultrasound transducer and pyroelectric detectors 1310, 1320 as shown in FIG. 13C. Of course, any desired number(s) of ultrasound transducers 1310 and pyroelectric detector 1320 may be integrated together, where FIGS. 13A-13C show two ultrasound transducers 1310 next to two pyroelectric detector 1320 shown as reference designation A and B.

In this example shown in FIG. 13A, the piezoelectric layer 1322, which may be undoped or La or Mn doped lead titanate zirconate, is processed on top of the membrane 1330. Between the membrane 1330 and the piezoelectric layer 1322, a barrier layer 1317 may be applied, similar to the barrier layer shown as reference numeral 230 in FIGS. 2A and 617 in FIG. 6, and may be titanium oxide or zirconium oxide (e.g., $TiO_2$ or $ZrO_2$) for example.

This piezoelectric layer 1322 serves also as pyroelectric sensor material of the pyroelectric detector 1320 which is formed and processed next to the ultrasound transducer 1310. The advantage of having the pyroelectric detector 1320 isolated from other elements (e.g., other transducers) on the free membrane 1330 is that the elements are thermally isolated. Having thermally isolated pyroelectric detector(s) 1320 prevents temperature reduction due to heat conduction through a substrate. The piezoelectric or pyrolelectric layer 1322 have a typical thickness of 1-6 µm. The piezoelectric/pyroelectric layer 1322 may be patterned to prevent cross talk between the ultrasound transducer elements 1310 of the array 1300, as well as between the ultrasound and pyroelectric devices or elements 1310, 1320.

Top electrodes 1342 are applied (similar to electrode 1242 in FIG. 12 and/or interdigital electrodes 840, 845 shown in FIG. 8A), which may be Titanium (Ti) having a thickness of approximately 50 nm, and gold (Au) of approximately 1 µm. However, other material may also be used for the electrode, such as nickel/chromium (Ni/Cr) electrodes which provide for optimum absorption of IR radiation. The electrodes 1342 are patterned to create electrodes for the ultrasound transducers 1310 and also the electrodes for the pyroelectric detector devices 1320. Alternatively the electrodes for the ultrasound transducers 1310 may be made from Ti/Au to have optimum electrodes for ultrasonic bonding of the substrate dies, and the electrodes for the IR sensors 1320 may be formed from Ni/Cr. The Ni/Cr may be the same layer that is used as an adhesion layer for the thicker metals of the ultrasound transducer.

Each pyroelectric element 1320 may have interdigitated top electrodes as in FIG. 2B shown as reference numerals 1342 in FIG. 13A. For highest sensitivity they form two sensors. One sensor is illuminated by the infrared light, e.g., via a lens, whereas the second sensor is not illuminated. The differential signal indicates any change in the infrared radiation, while slow changes of the ambient temperature are cancelled. As optical system to optimize signals including signal to noise ratios, may be included such as Fresnel lenses. The pyroelectric or piezoelectric material 1322 may be poled by applying a DC (Direct Current) field at elevated temperatures, such as 180° C. An increase of the temperature in one pyroelectric element 1320 due to IR radiation, focused on this one pyroelectric element 1320, may be used for motion detection. The change of the temperature of the pyroelectric element 1320 results in a change of the polarization of the pyroelectric element 1320 and hence also results in the release of charges at the surface. These charges give rise to a voltage which is read out by a preamplifier which indicates motion (or a change of temperature).

As is well known, a lens 1380 may be provided in front of the membrane 1330 of the pyroelectric element 1320 to receive the IR radiation 1385. The lens 1380 may be isolated from the membrane 1330 to reduce thermal conduction and may be configured to be directional to receive IR radiation 1385 from a desired direction. Ultrasound waves that may be transmitted or received by the ultrasonic transducer 1310 are shown as arrow 1387 in FIG. 13A.

For desired operation, different designs are possible. In one version, two pyroelectric elements may be designed in series and have opposite poling. Such a dual element layout may be used to compensate for changes of background temperature, which heats up both elements simultaneously. Besides the dual element design shown in FIGS. 13B-13C, other designs using any desired number of pyroelectric elements may be used, such as four elements or more.

Further devices, circuits and electronics may be provided, such as integrated in the substrate 1340. Electronics such as an amplifier, which may be a FET (Field Effect Transistor) 1390 may be mounted separately on a board 1395 and wire bonded to the device, comprising the ultrasound transducers and pyroelectric sensors. One example is shown in FIG. 13A. Also any other stack of systems may be formed. For example, an alternative embodiment is shown in FIG. 13B, where the substrate 1340 is mounted on the ultrasound transducers/array and also extends over and used to protect the pyroelectric sensors/array. Of course, any other desired stack may be formed. In FIG. 13C, a further embodiment is shown where the front substrate 210' is removed underneath the membrane in such as way, that it forms a support 210'' between the piezoelectric ultrasound transducer or transducer arrays and the pyroelectric sensor or sensor arrays.

Thus, an array of detectors may include only ultrasound detectors, only IR detectors, or a combination of ultrasound and IR detectors using any desired number or combination of detectors, where any desired number of infrared elements may be formed next to ultrasound elements for form a combined arrays which may be used for both ultrasound and infrared transmission, detection and imaging. Such combined ultrasound and IR transducers may be formed by thin film processing, where electrodes may be on the same side or opposite sides of the piezoelectric material, similar to that previously described, such as in connection with FIGS. 2A-8D, for example.

Figure 14A:
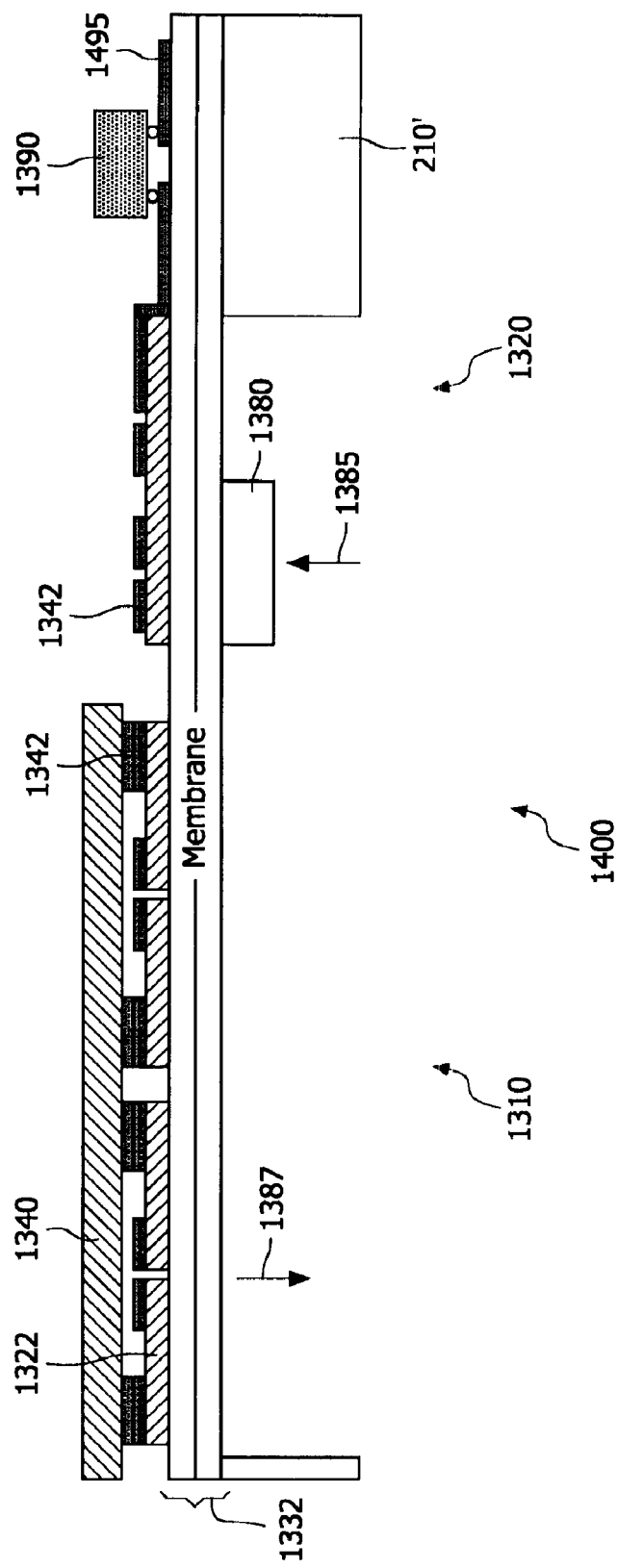
FIGS. 14A-14C show arrays including a combination of an ultrasound transducer and a pyroelectric transducer with circuitry mounted by flip chip mounting or wire bonding according to one embodiment of the present system.
Figure 14B:
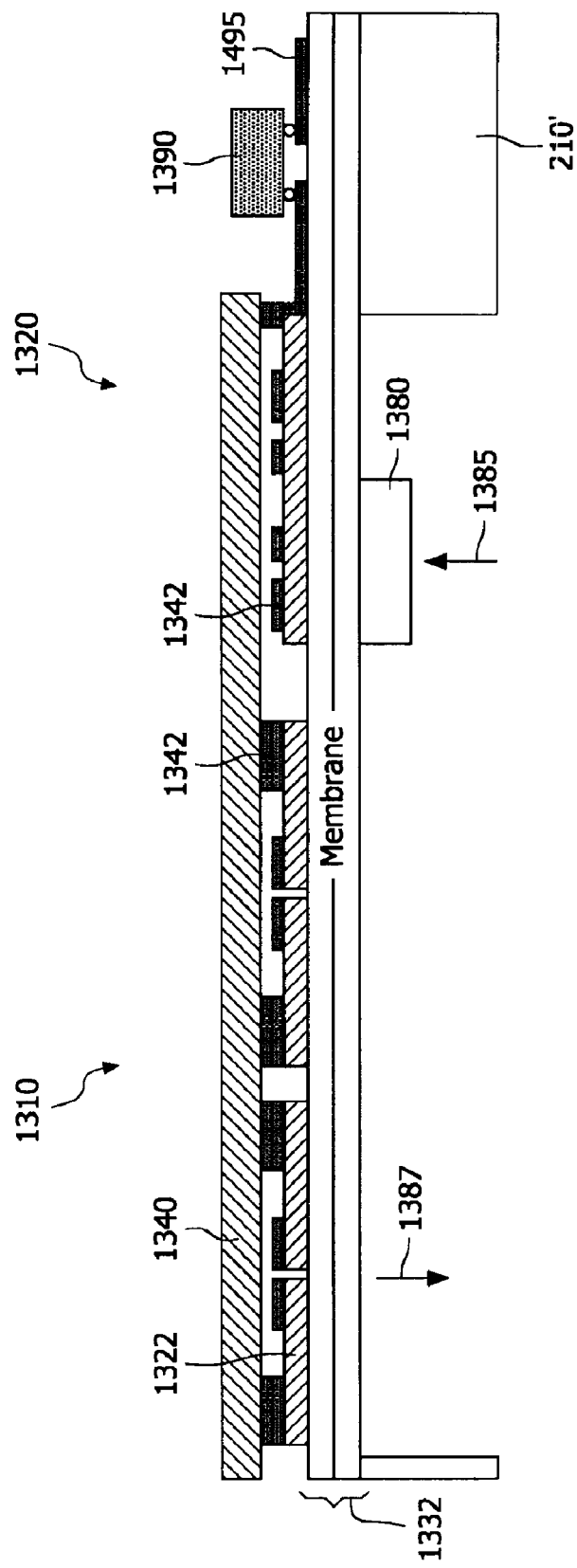
Figure 14C:
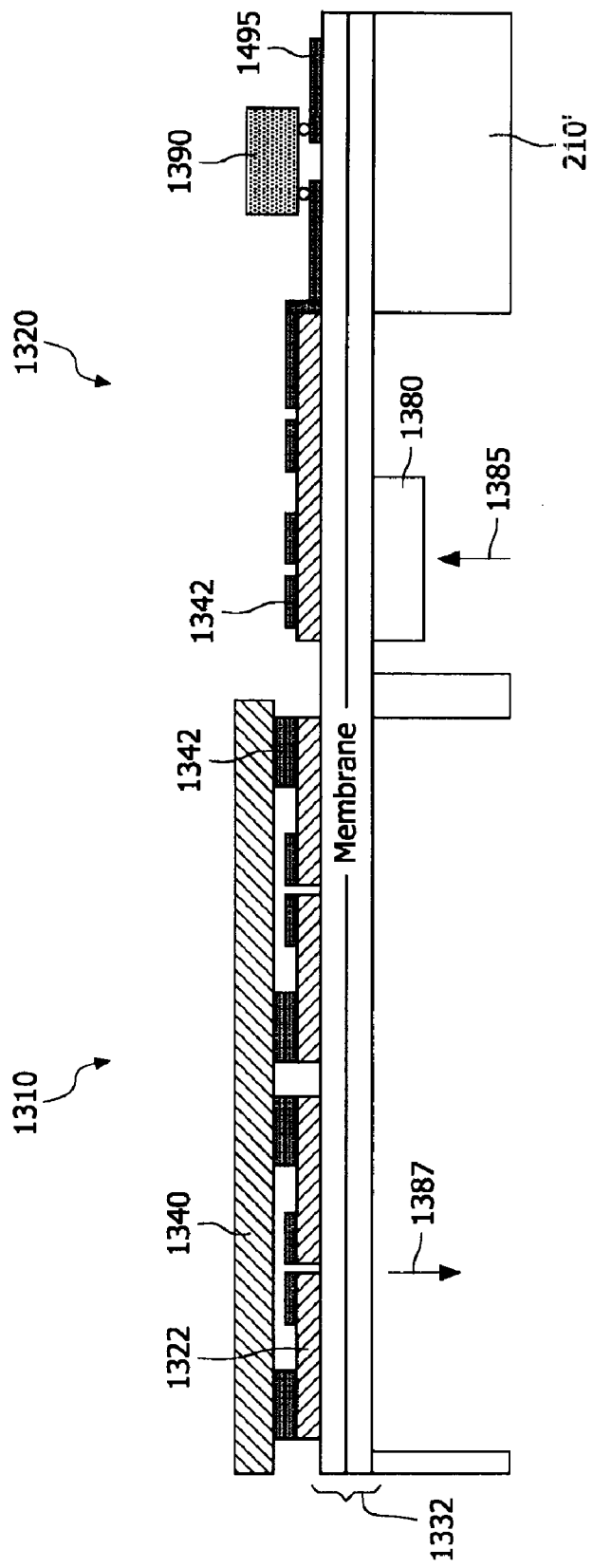

In another embodiment of an array 1400 shown in FIG. 14A, the circuitry, such as amplifier 1390 may be mounted by flip chip mounting or wire bonding 1495 next to the transducer and pyroelectric elements 1310, 1320 on the carrier or front substrate 210' to achieve a system in package solution. This carrier 210' which is typically a Si carrier may also comprise other elements, functions and devices, such as resistors, for example. It should be noted that the carrier or front Si substrate 210' is similar to the front substrate 210 shown in FIG. 2A, 2C. In this way, a substantially miniaturized low profile ultrasound detector array and pyroelectric detector array can be achieved, as shown in FIG. 14A. Similar to FIG. 13B, as shown in FIG. 14B, the back substrate 1340 may be extended and used to protect also the pyroelectric sensors. Alternatively as shown in FIG. 14C, to support the device, the front substrate 210' may be patterned in such as way as to form a support 210" that separates the piezoelectric ultrasound transducers and the pyroelectric sensors, similar to that described in connection with FIG. 13C.

Figure 2A:
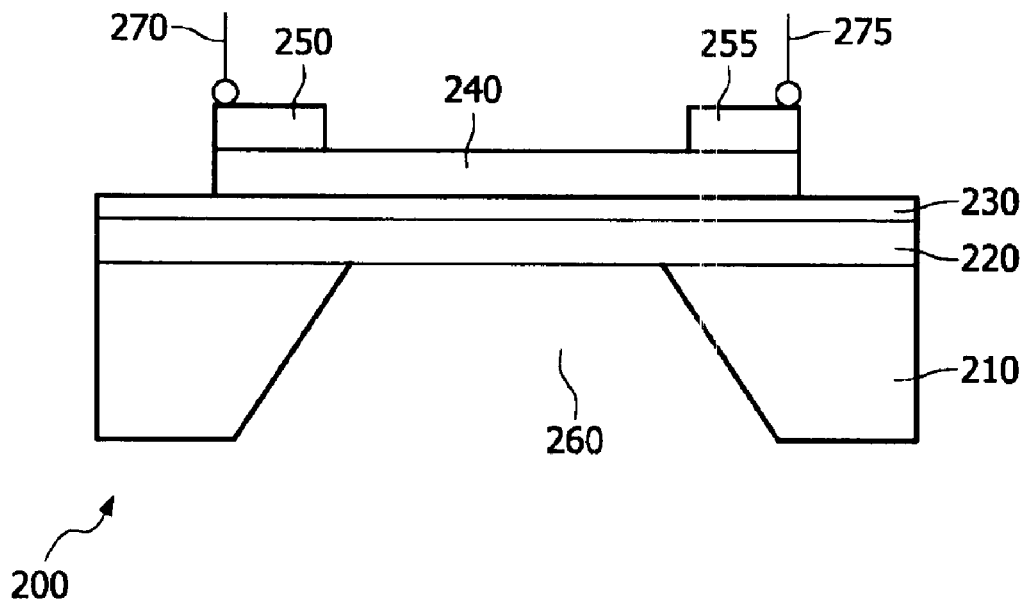
FIGS. 2A-2C show a conventional sensor realized with bulk micro-machining.
Figure 2B:
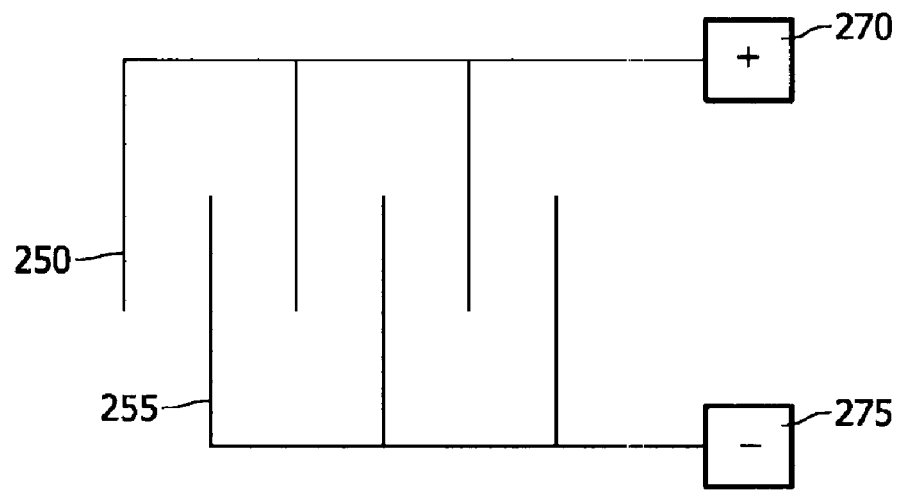
Figure 2C:
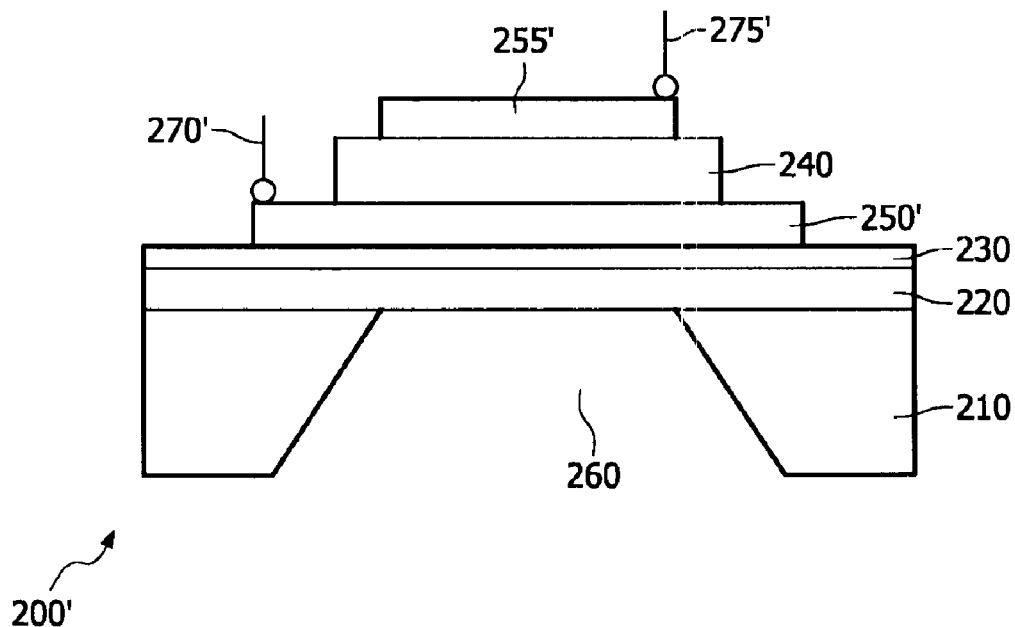
Figure 15A:
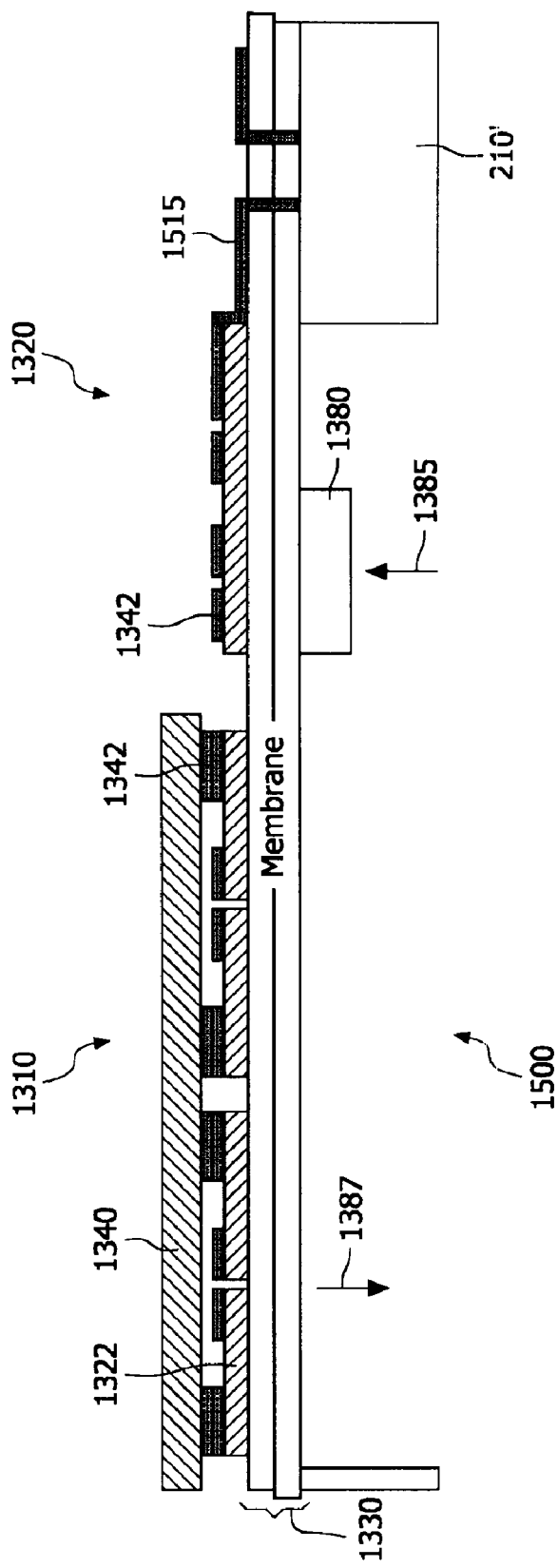
FIGS. 15A-15C shows arrays including a combination of an ultrasound transducer and a pyroelectric transducer with integrating circuitry according to one embodiment of the present system.

In another alternative embodiment of a transducer array 1500 shown in FIG. 15, even further miniaturization may be achieved by integrating circuitry such as the amplifier which may be, for example a FET, into the front Si substrate 210', which is similar to the front substrate 210 shown in FIG. 2A, 2C. This is in contrast to having a non-integrated amplifier which may be stand alone and connected or mounted to the transducer by any means such as flip chip mounting or wire bonding 1495, as described in connection with FIG. 14A. As also described in connection with FIG. 2A, 2C, the front substrate 210, 210' is used as a carrier to form thereon and pattern the various layers for realizing the ultrasound transducer and/or pyroelectric transducer. As described, portions of the front substrate are removed (e.g., to form opening 260 shown in FIGS. 2A, 2C) thus leaving substrate sections 210, 210'. Interconnects 1515 may be provided as needed, such as between the electrodes 1342 and the FET integrated in the front Si substrate 210'.

Figure 15B:
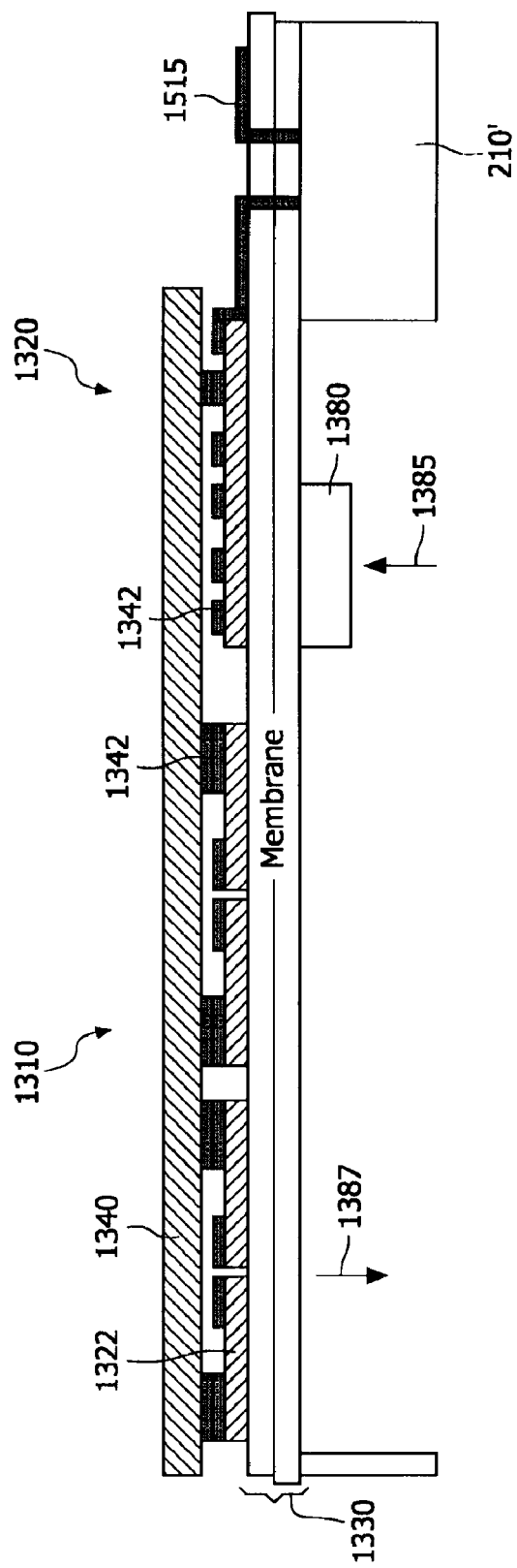
Figure 15C:
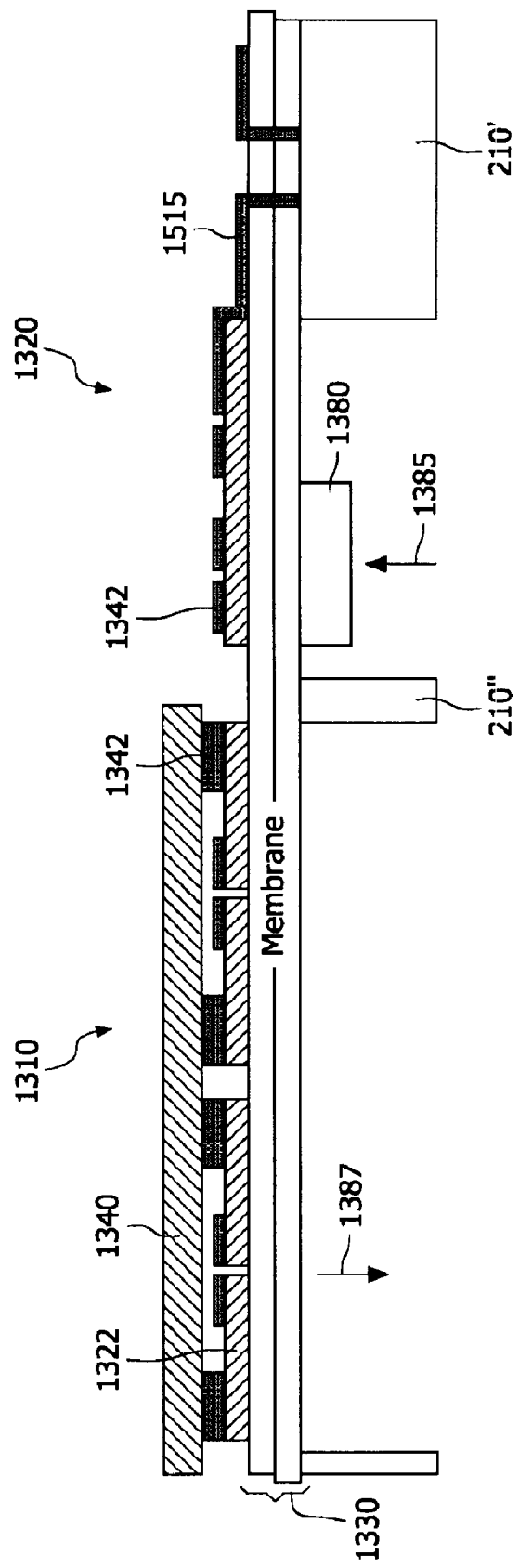

Alternatively, similar to that described in connection with FIGS. 13B and 14B, the back substrate 1340 may be used not only for mounting on the piezoelectric transducer, but may also be extended over the pyroelectric sensors and used to protect the pyroelectric sensors, as shown in FIG. 15B. Further, the front substrate 210' may be patterned in such as way, that it separates the piezoelectric ultrasound transducers and the pyroelectric sensors, as shown in FIG. 15C, and similarly shown in FIGS. 13C and 14C.

It should be understood that the above description of the various embodiments showing electrodes on one side of the piezoelectric layer (referred to as the d33 mode) are equally applicable to embodiments operating in the d31 mode where electrodes are on opposite sides of the piezoelectric layer, as shown and described in connection with FIGS. 5 and 8B-8C.

For example, in the embodiment of a transducer array 1600 shown in FIG. 16, the ultrasound transducer 1610 is operating in the d31 mode (in contrast to the previous embodiment shown in FIGS. 12-15, for example, which operate in the d33 mode). In the d31 mode, the electrodes to actuate the piezoelectric layer are designed on opposite sides of the piezoelectric film. This design has the advantage that the transducers can operate at lower voltages. The ultrasound transducer 1610 may be formed similar to previously described, such as described in connection with FIGS. 2C, 5 and 8B-8C.

In another embodiment of an array 1600 shown in FIG. 16A, in addition to the ultrasound transducer 1610 having electrodes on both sides of piezoelectric regions 1621, the pyroelectric detector elements 1620 are also processed as plate capacitors with the electrodes on opposite sides of the pyroelectric layer 1622. The pyroelectric IR transducer 1620 may be realized by forming a first or front electrode 1642 over the membrane 1330 which is being carried on the full front substrate 210' (i.e., before removal of portions of the substrate 210' such as to expose the membrane 1330, similar to that described above, such as in connection with FIGS. 2C, 5 and 8B-8C). Next, the pyroelectric piezoelectric layer 1622 is formed over the front electrode 1642, and a second or back electrode 1644 is formed over the piezoelectric layer 1622, and patterned if desirable. Portions of the front substrate 210' are removed next as desired such as to expose the membrane 1330, and portions of the membrane 1330 are removed as desired to expose the front electrode 1642 which may be patterned as desired. Next a lens 1380 may be provided one portions of the front electrode 1642, where the lens may be thermally isolated.

The pyroelectric/piezoelectric regions and layer 1621, 1622 are poled by applying a DC field and at elevated temperatures, such as 100-300° C. (e.g., 180° C.). The polarization of the pyroelectric piezoelectric layers 1621, 1622 is perpendicular to the layers 1621, 1622. Two or more pyroelectric elements with polarization opposite to each other may be designed in series. The change of polarization of the elements due to temperature change from infrared radiation is read out with a preamplifier, which may be a FET either integrated into the front silicon substrate 210' or mounted/connected to the transducers along with any other desired electronic components and circuits. That is, the electronic circuits including the FET may be realized on a separate Printed Circuit Board (PCB), and/or mounted by wire-bonding or flip-chip mounting on the Si carrier 210', for example. In an alternative to FIG. 16A, also the membrane underneath the electrode and pyroelectric layers may not be removed as shown in FIG. 16B.

It should be noted that the lens 1380 of the IR detectors shown in the various figures are typically segmented into segments of different characteristics, such as different curvatures and different thickness similar to fresnel lenses, where each segment is configured to receive IR radiation from a particular region or zones. The number and type of segment may be varied based on the coverage area where, typically, a wider coverage area requires higher number of segments. Depending on the size of the coverage area being monitored for IR radiation, a typical lens used with IR detectors includes 7-14 segments. Such lenses are relatively expensive and cost increases with increasing number of segments.

Instead of having an expensive lens with many segments, an array of thin film sensors may be used with a lens having reduce or no segments, and yet having a wide coverage area. Thus, using an array of thin film transducers allows making the lens easier to design and reduces thickness thus providing compact devices as well as lowering cost. For example, an IR motion/presence sensor for ceiling applications may have 4 elements or sensors (quad device) and a lens with 14 segments to provide 4 times 14 or 56 detection areas. Instead, the IR pyroelectric sensor may contain 14 elements or sensors and the lens may only have 4 segments and yet still have the same number of detection areas, namely 14 time 4 or 56 detection areas.

In another example shown in FIGS. 17A-17C the ultrasound transducer 1310, operating in d33 or d31 mode is using a piezoelectric thin film layer with a dedicated composition and the pyroelectric detector 1320 is using another dedicated layer with a special composition which is different from the composition of the piezoelectric thin film layer of the ultrasound transducer 1310. In these embodiments of the integrated ultrasound and pyroelectric/infrared (IR) devices shown in FIGS. 17A-17C, the integrated ultrasound transducers 1310 may have a dedicated piezoelectric composition with La doped lead titanate zirconate, and the integrated IR detectors 1320 may have a dedicated pyroelectric composition of La, Mn doped lead titanate zirconate.

One illustrative example or embodiment is given in FIG. 17A. This embodiment shows a system of an ultrasound transducer or array of ultrasound transducers and pyroelectric sensor or arrays of pyroelectric sensors similar to FIG. 13A. The piezoelectric ultrasound transducers are operating in the d33 mode in this example. On top of a portion of the membrane 1330, which may be for example silicon nitride and silicon oxide, but also any other membrane stack, a piezoelectric layer 1322, e.g., a lanthanum (La) doped lead titanate zirconate layer is deposited and patterned, so that it is located only in the area, where the ultrasound transducer is functioning. On another part of the membrane 1330, where the pyroelectric sensor or the array of sensors is located, a pyroelectric thin film layer 1722 is deposited on top of membrane 1330. The pyroelectric thin film layer may be, for example, a lanthanum and manganese (Mn) doped lead titanate zirconate layer.

FIGS. 17B and 17C show modifications of FIG. 17A where, similar to FIGS. 13A-13C, the mounted back substrate 1340 extends to cover the ultrasound transducer (s) and the pyroelectric sensor(s) as shown in FIG. 17B. In FIG. 17C, the ultrasound transducer area with the dedicated piezoelectric thin film material is separated from the pyroelectric sensor area, by patterning the front substrate 210', similar to that described in connection with FIGS. 13C, 14C and 15C.

Finally, the above-discussion is intended to be merely illustrative of the present system and should not be construed as limiting the appended claims to any particular embodiment or group of embodiments. Thus, while the present system has been described in particular detail with reference to specific exemplary embodiments thereof, it should also be appreciated that numerous modifications and alternative embodiments may be devised by those having ordinary skill in the art without departing from the broader and intended spirit and scope of the present system as set forth in the claims that follow. The specification and drawings are accordingly to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same or different item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

The invention claimed is:

1. A transducer comprising:
a membrane configured to change shape in response to a force;
piezoelectric layer disposed over the membrane;
first and second electrodes in contact with the piezoelectric layer, wherein an electric field between the first and second electrodes is proportional to mechanical movement of the piezoelectric layer;
first and second supports located at peripheral sides of the piezoelectric layer, the first and second supports each comprising a first support layer and a second support layer, the first and second supports including piezoelectric material of the piezoelectric layer and conductive material of the first and second electrodes; and
a substrate supported by said first and second supports.

2. The transducer of claim 1, wherein a support height of the first and second supports is greater than first a combined height of the piezoelectric layer and the first electrode when the first and second electrodes are formed on one side of the piezoelectric layer, and wherein the support height is greater than a second combined height of the piezoelectric layer and the first and second electrodes when the first and second electrodes are formed on opposite sides of the piezoelectric layer.

3. The transducer of claim 1, wherein the membrane comprises a silicon oxide layer located over a silicon nitride layer, the piezoelectric layer being located over the silicon oxide layer.

4. The transducer of claim 1, further comprising a barrier layer, wherein the membrane comprises a silicon oxide layer formed over a silicon nitride layer; the barrier layer being located over the silicon oxide layer and the piezoelectric layer being located over the barrier layer.

5. The transducer of claim 1 wherein the piezoelectric layer comprises a thin film of lead titanate zirconate.

6. The transducer of claim 1 wherein the piezoelectric layer comprises a thin film of doped lead titanate zirconate.

7. The transducer of claim 1 wherein the piezoelectric layer is continuous.

8. The transducer of claim 1 wherein the piezoelectric layer is patterned.

* * * * *